US006822986B2

(12) United States Patent
Nasu et al.

(10) Patent No.: US 6,822,986 B2
(45) Date of Patent: Nov. 23, 2004

(54) METHOD OF CONTROLLING A WAVELENGTH OF A SEMICONDUCTOR LASER, OPTICAL MODULE, OPTICAL TRANSMITTER, WDM OPTICAL TRANSMISSION APPARATUS, AND METHOD OF CONTROLLING A WAVELENGTH OF AN OPTICAL MODULE

(75) Inventors: Hideyuki Nasu, Tokyo (JP); Takehiko Nomura, Tokyo (JP); Mizuki Oike, Tokyo (JP)

(73) Assignee: The Furakawa Electric Co., Ltd., Tokyo (JP)

(*) Notice: Subject to any disclaimer, the term of this patent is extended or adjusted under 35 U.S.C. 154(b) by 0 days.

(21) Appl. No.: 10/159,120

(22) Filed: Jun. 3, 2002

(65) Prior Publication Data

US 2003/0043865 A1 Mar. 6, 2003

(30) Foreign Application Priority Data

Jun. 1, 2001 (JP) ........................................ 2001-166680
Nov. 16, 2001 (JP) ........................................ 2001-352283

(51) Int. Cl.$^7$ .................................................. H01S 3/13
(52) U.S. Cl. ............................. 372/32; 372/34; 372/22; 372/98; 372/19; 372/25; 372/29.05; 372/38.07
(58) Field of Search ............................. 372/32, 34, 22, 372/98, 19, 29, 15, 38.07, 25

(56) References Cited

U.S. PATENT DOCUMENTS

| 5,265,115 A | * | 11/1993 | Amano ........................ 372/75 |
| 5,798,859 A | * | 8/1998 | Colbourne et al. .......... 359/247 |
| 6,122,301 A | * | 9/2000 | Tei et al. ....................... 372/32 |
| 6,178,002 B1 | * | 1/2001 | Mueller-Wirts .............. 356/491 |
| 6,282,215 B1 | * | 8/2001 | Zorabedian et al. ........... 372/20 |
| 2002/0126345 A1 | * | 9/2002 | Green et al. ................. 359/122 |
| 2002/0172239 A1 | * | 11/2002 | McDonald et al. ............ 372/20 |
| 2003/0058907 A1 | * | 3/2003 | Nasu et al. .................... 372/34 |

FOREIGN PATENT DOCUMENTS

| JP | 2000-056185 | 2/2000 |
| JP | 2001-044558 | 2/2001 |

* cited by examiner

Primary Examiner—Leon Scott, Jr.
(74) Attorney, Agent, or Firm—Oblon, Spivak, McClelland, Maier & Neustadt, P.C.

(57) ABSTRACT

An optical module includes a light-emitting device that outputs laser light, a temperature detection unit that is arranged in proximity to the light-emitting device and detects the temperature of the light-emitting device, a wavelength monitor unit that receives laser light outputted from the light-emitting device and having passed through an optical filter and monitors the wavelength of the laser light, and a temperature adjustment unit that adjusts the wavelength of laser light outputted from the light-emitting device based on a signal outputted from the wavelength monitor unit. The temperature adjustment unit adjusts the wavelength of the laser light so as to fall within a wavelength range, in which the wavelength is adjustable by the wavelength monitor unit, based on a signal from the temperature detection unit, and then adjusts the wavelength of the laser light so as to be locked at a predetermined wavelength based on the signal from the wavelength monitor unit. The signal from the temperature detection unit is used to correct lock wavelength shift caused by the temperature characteristic of the optical filter by estimating the temperature of the optical filter based on the temperature of the light-emitting device.

21 Claims, 30 Drawing Sheets

-------- TEMPERATURE OF LIGHT-EMITTING DEVICE

———— TEMPERATURE OF OPTICAL FILTER

---------- THERMISTOR RESISTANCE OF LIGHT-EMITTING DEVICE

_____ THERMISTOR RESISTANCE OF OPTICAL FILTER

METHOD OF CONTROLLING A WAVELENGTH OF A SEMICONDUCTOR LASER, OPTICAL MODULE, OPTICAL TRANSMITTER, WDM OPTICAL TRANSMISSION APPARATUS, AND METHOD OF CONTROLLING A WAVELENGTH OF AN OPTICAL MODULE

BACKGROUND OF THE INVENTION

The present invention relates to a method of controlling a wavelength of a semiconductor laser applied to a WDM (wavelength division multiplexing) communication system, an optical module, an optical transmitter, a WDM optical transmission apparatus, and a method of controlling a wavelength of an optical module.

In the field of dense WDM, it is generally required that the optical signals are stable in wavelength for a long time period. Consequently, there have conventionally been developed techniques of providing the function of a wavelength monitor in an optical module.

SUMMARY OF INVENTION

The present invention provides a method of controlling a wavelength of a semiconductor laser for controlling an optical module that includes:

a light-emitting device that outputs laser light, a temperature detection unit that detects a temperature of the light-emitting device;

a wavelength monitor unit that monitors a wavelength of the laser light outputted from the light-emitting device and having passed through an optical filter; and a wavelength adjustment unit that adjusts the wavelength of the laser light outputted from the light-emitting device based on a signal outputted form the wavelength monitor unit, wherein a signal from the temperature detection unit is used to correct wavelength shift caused by a temperature characteristic of the optical filter by estimating a temperature of the optical filter.

The present invention provides an optical transmitter comprising:

an optical module including a light-emitting device that outputs laser light, a temperature detection unit that detects a temperature of the light-emitting device, a wavelength monitor unit that monitors a wavelength of the laser light outputted from the light-emitting device and having passed through an optical filter, and a wavelength adjustment unit that adjusts the wavelength of the laser light outputted from the light-emitting device based on a signal outputted form the wavelength monitor unit, the optical module being used to correct wavelength shift caused by a temperature characteristic of the optical filter by estimating a temperature of the optical filter using a signal from the temperature detection unit;

a control unit that fixes the lasing wavelength of the laser light outputted from the light-emitting device to a predetermined wavelength based on the signal outputted from the wavelength monitor unit; and a correction unit that estimates the temperature of the optical filter based on the temperature of the light-emitting device detected by the temperature detection unit and outputs, to the control unit, a correction signal commanding the correction of the wavelength shift caused by the temperature characteristic of the optical filter based on the estimated temperature of the optical filter.

The present invention provides a WDM optical transmission apparatus comprising:

an optical module including a light-emitting device that outputs laser light, a temperature detection unit that detects a temperature of the light-emitting device, a wavelength monitor unit that monitors a wavelength of the laser light outputted from the light-emitting device and having passed through an optical filter, and a wavelength adjustment unit that adjusts the wavelength of the laser light outputted from the light-emitting device based on a signal outputted form the wavelength monitor unit, the optical module being used to correct wavelength shift caused by a temperature characteristic of the optical filter by estimating a temperature of the optical filter using a signal from the temperature detection unit; and a plurality of optical transmitters that each include a control unit that fixes the lasing wavelength of the laser light outputted from the light-emitting device to a predetermined wavelength based on the signal outputted from the wavelength monitor unit, and a correction unit that estimates the temperature of the optical filter based on the temperature of the light-emitting device detected by the temperature detection unit and outputs, to the control unit, a correction signal commanding the correction of the wavelength shift caused by the temperature characteristic of the optical filter based on the estimated temperature of the optical filter, wherein optical signals outputted from the optical transmitters are wavelength-multiplexed and transmitted.

The first present invention provides an optical module comprising:

a light-emitting device that outputs laser light;

an optical filter through which laser light outputted from a light-emitting device passes;

a temperature control module that controls a temperature of the light-emitting device and the optical filter;

a light-receiving device that receives the laser light through the optical filter; and a lasing wavelength control unit that performs control of a temperature of the light-emitting device based on detection results of the light-receiving device, wherein the lasing wavelength control unit satisfies the following relation:

$$z = \Delta y(1 - a/x)$$

where x is a shift amount per unit temperature of a lasing wavelength in a light-emitting device,
$\Delta y$ is a set lasing wavelength spacing in the lasing wavelength control unit,
z is a wavelength width per period of the wavelength-light transmittance curve of the optical filter, and
a is a shift amount per unit temperature of the wavelength-light transmittance characteristic of the optical filter.

The second present invention provides an optical module comprising:

an optical filter through which laser light outputted from a light-emitting device passes;

a temperature detection module that detects a temperature of the optical filter;

a light-receiving device that receives the laser light through the optical filter; and a lasing wavelength control unit that performs control of a temperature of the light-emitting device based on detection results of the light-receiving device and the temperature detection module, wherein the lasing wavelength control unit satisfies the following relation:

$$z=\Delta y(1-a/x)$$

where x is a shift amount per unit temperature of a lasing wavelength in a light-emitting device, Δy is a set lasing wavelength spacing in the lasing wavelength control unit, z is a wavelength width per period of the wavelength-light transmittance curve of the optical filter, and a is a shift amount per unit temperature of the wavelength-light transmittance characteristic of the optical filter.

The present invention provides a method of controlling a wavelength of an optical module, comprising the steps of:

(a) generating a waveform with periodicity by having laser light outputted from a light-emitting device pass through an optical filter;

(b) detecting light intensity by causing laser light outgoing from the optical filter to enter a light-receiving device; and (c) detecting a change of lasing wavelength of the laser light outputted from the light-emitting device using a detection result of the light-receiving device and performing control of a temperature of the light-emitting device using a lasing wavelength control unit with reference to a result of the lasing wavelength change detection so as to satisfy the following relation:

$$z=\Delta y(1-a/x)$$

where x is a shift amount per unit temperature of a lasing wavelength in the light-emitting device, Δy is a set lasing wavelength spacing in the lasing wavelength control unit, z is a wavelength width per period of the wavelength-light transmittance curve of the optical filter, and a is a shift amount per unit temperature of the wavelength-light transmittance characteristic of the optical filter.

DETAILED DESCRIPTION OF THE PREFERRED EMBODIMENTS

Embodiments of the present invention will be described below with reference to the drawings, with the embodiments being compared with a conventional technique.

A conventional technique of providing the function of a wavelength monitor within an optical module is, for instance, disclosed in JP 2000-56185 A.

Figure 15:
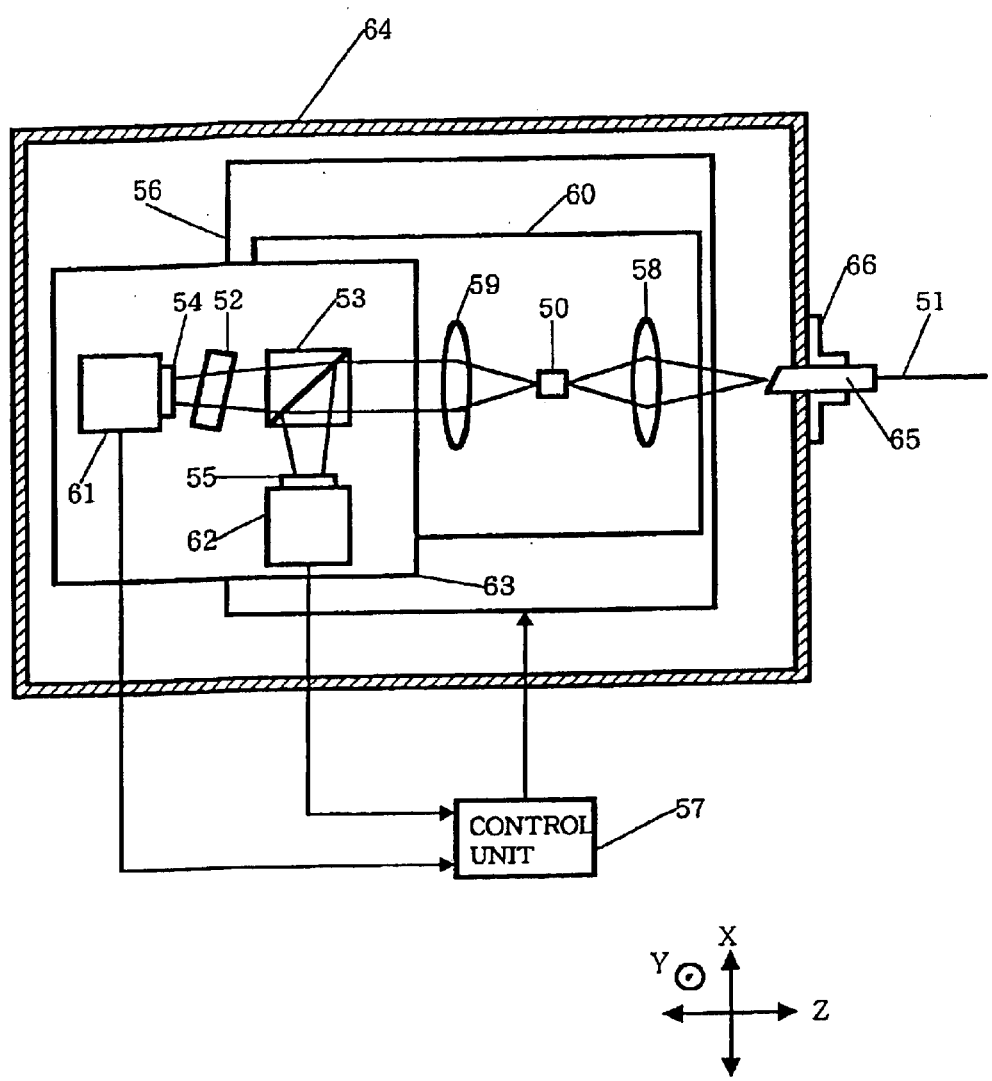
FIG. 15 is an explanatory drawing showing a construction of a conventional optical module.

FIG. 15 is an explanatory drawing showing a construction of a conventional optical module. As shown in FIG. 15, the conventional optical module includes: a light-emitting device 50 that is constructed using a semiconductor laser diode or the like and outputs laser light with a predetermined lasing wavelength; an optical fiber 51 that is optically coupled to the light-emitting device 50 and sends laser light outputted from a front-side (right-side in FIG. 15) end surface of the light-emitting device 50 to the outside; an optical filter 52 having a cut-off wavelength that is approximately the same as the lasing wavelength of the light-emitting device 50; a beam splitter 53 that is constructed from a half mirror and divides laser light outputted from a back-side (left-side in FIG. 15) end surface of the light-emitting device 50 into two laser lights; a first light-receiving device 54, such as a photodiode, that receives one laser light out of the two laser lights divided by the beam splitter 53 and which has passed through the optical filter 52; a second light-receiving device 55, such as a photodiode, that receives the other laser light out of the two laser lights divided by the beam splitter 53; and a Peltier module 56 that adjusts the temperature of the light-emitting device 50. Also, a control unit 57 is connected to the optical module. This control unit 57 controls the Peltier module 56 so that the wavelength of the light-emitting device 50 is controlled, based on PD currents outputted from the first light-receiving device 54 and the second light-receiving device 55.

Figure 16:
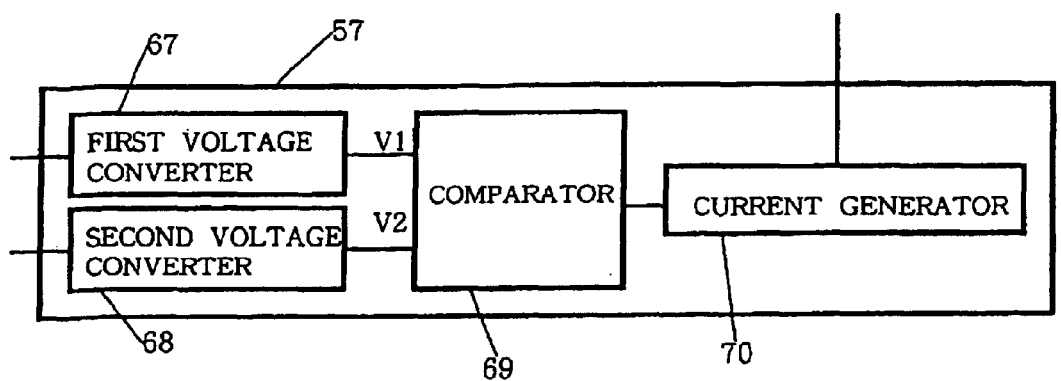
FIG. 16 is a block diagram showing an example of a construction of a control unit.

FIG. 16 is a block diagram showing an example of the construction of the control unit 57. As shown in FIG. 16, for instance, the control unit 57 includes: a first voltage converter 67 that converts a first PD current outputted from the first light-receiving device 54 into a first voltage V1; a second voltage converter 68 that converts a second PD current outputted from the second light-receiving device 55 into a second voltage V2; a comparator 69 that outputs a difference or ratio between the first voltage V1 outputted from the first voltage converter 67 and the second voltage V2 outputted from the second voltage converter 68 as a control signal; and a TEC (Thermo Electric Cooler) current generator 70 that outputs a temperature control current for raising or lowering the temperature of the Peltier module 56 based on the control signal outputted from the comparator 69.

Between the light-emitting device 50 and the optical fiber 51, there is arranged a condensing lens 58 that couples the laser light outputted from the front-side end surface of the light-emitting device 50 to the optical fiber 51. Also, between the light-emitting device 50 and the beam splitter 53, there is arranged a collimating lens 59 that converts the laser light outputted from the back-side end surface of the light-emitting device 50 into parallel light.

The light-emitting device 50, the condensing lens 58, and the collimating lens 59 are fixed on an LD carrier 60.

The first light-receiving device 54 and the second light-receiving device 55 are fixed on a first PD carrier 61 and a second PD carrier 62, respectively.

The beam splitter 53, the optical filter 52, the first PD carrier 61, and the second PD carrier 62 are fixed on a metallic substrate 63. This metallic substrate 63 is fixed on a surface of the LD carrier 60 and this LD carrier 60 is fixed on the Peltier module 56.

The light-emitting device 50, the beam splitter 53, the optical filter 52, the condensing lens 58, the collimating lens 79, the LD carrier 60, the first PD carrier 61, the second PD carrier 62, the metallic substrate 63, and the Peltier module 56 are provided within a package 64. Also, a ferrule 65 holding a tip portion of the optical fiber 51 is fixed to a side portion of the package 64 through a sleeve 66.

The laser light outputted from the front-side end surface of the light-emitting device 50 is condensed by the condensing lens 58, is incident on the optical fiber 51 held by the ferrule 65, and is sent to the outside.

On the other hand, the laser light outputted from the back-side end surface of the light-emitting device 50 is converted into parallel light by the collimating lens 59 and is divedeed by the beam splitter 53 in two directions of a Z-axis direction (transmission direction) and an X-axis direction (reflection direction) which is perpendicular to the Z-axis direction. The laser light divedeed in the Z-axis direction is received by the first light-receiving device 54, while the laser light divedeed in the X-axis direction is received by the second light-receiving device 55.

Figure 17:
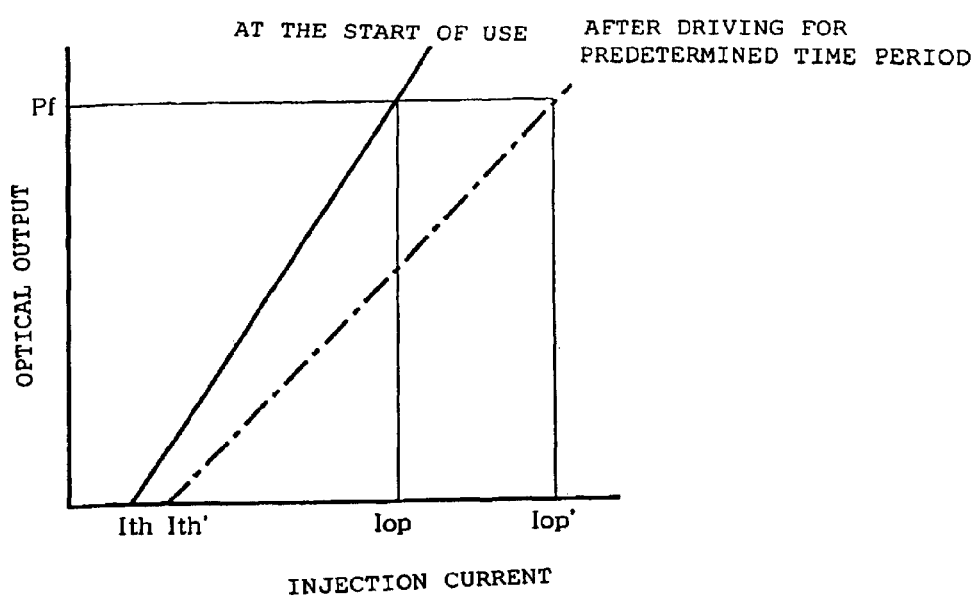
FIG. 17 is a graph illustrating the deterioration with time of a laser diode.

The PD currents outputted from the first light-receiving device 54 and the second light-receiving device 55 are inputted into the control unit 57 and the control unit 57 controls the adjustment of the temperature of the Peltier module 56 based on the values of the inputted PD currents, thereby controlling the wavelength of the light-emitting device 50. FIG. 17 is a graph illustrating the deterioration with time of a laser diode. As shown in FIG. 17, at the start of use of an optical module provided with a laser diode, a threshold value thereof is Ith. Also, an APC (Auto Power Control) circuit is driven so that there is obtained a predetermined optical output Pf.

When the use of the optical module is started, an injection current injected into the laser diode in order to obtain the optical output Pf is Iop. The characteristic of the laser diode is deteriorated in accordance with the elongation of the service time of the laser diode and, when the laser diode is used for a predetermined time period, the threshold value is increased from the initial value to Ith'. Also, the injection current injected into the laser diode in order to obtain the optical output Pf is also increased to Iop'.

Figure 18:
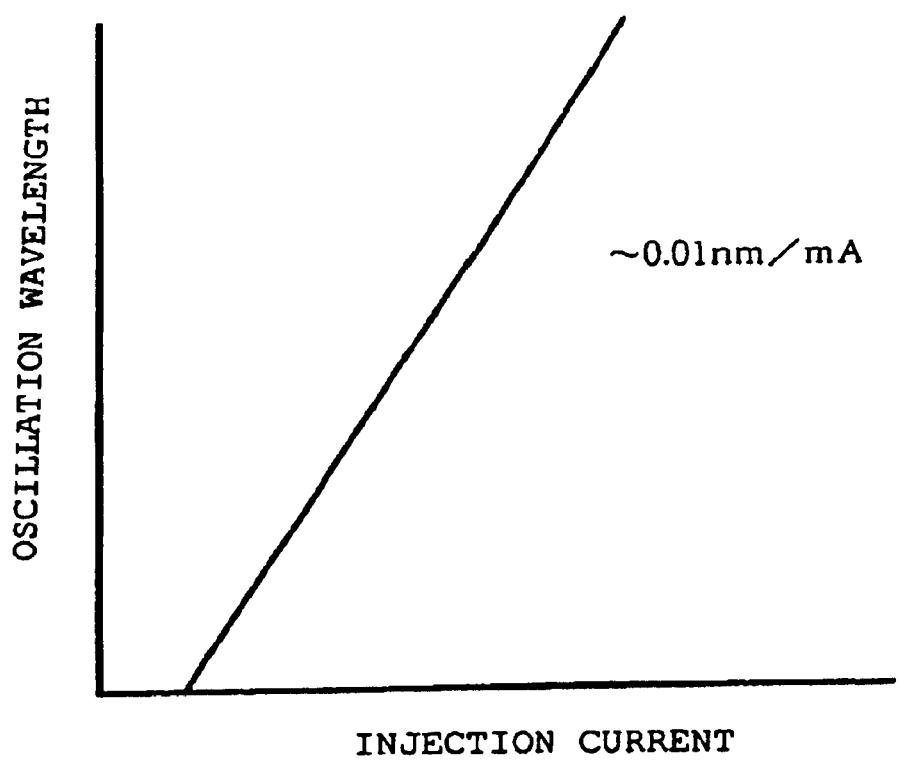
FIG. 18 is a graph showing a relation between an injection current and a lasing wavelength when the temperature of an LD carrier for the laser diode is fixed.

Also, as shown in FIG. 18, in the case where the temperature of the LD carrier (sub-mount) is fixed, the lasing wavelength of the laser diode has injection current dependency and this dependency is around 0.01 nm/mA under normal conditions. Accordingly, if the deterioration with time of the laser diode occurs in the case where the temperature of the LD carrier is constant, the lasing wavelength is shifted to a long side.

Figure 19:
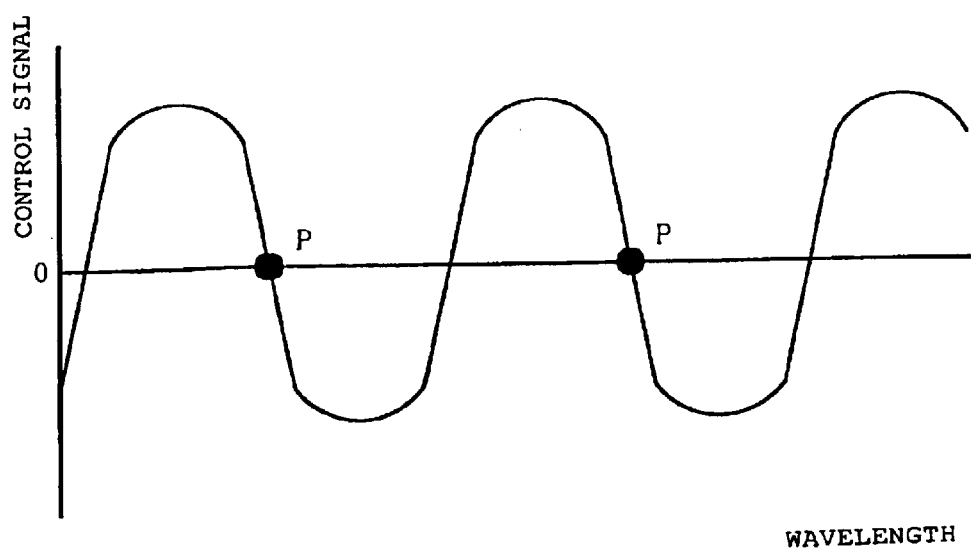
FIG. 19 is a graph showing a relation between the wavelength characteristic and wavelength of an optical filter.

In order to lock the wavelength of a laser diode having such a characteristic, there is used an optical filter. That is, the temperature of the LD carrier, on which the laser diode is mounted, is adjusted using the Peltier module by monitoring the wavelength, and the lasing wavelength of the optical module is fixed at a wavelength lock point P shown in FIG. 19. When the injection current is increased due to the deterioration with time of the laser diode, the temperature of the active layer of the laser diode is increased and the lasing wavelength is shifted to a long wavelength side. However, by driving a wavelength monitor using an optical filter, the wavelength shift is corrected, so that the temperature of the LD carrier is decreased by the Peltier module.

Figure 20:
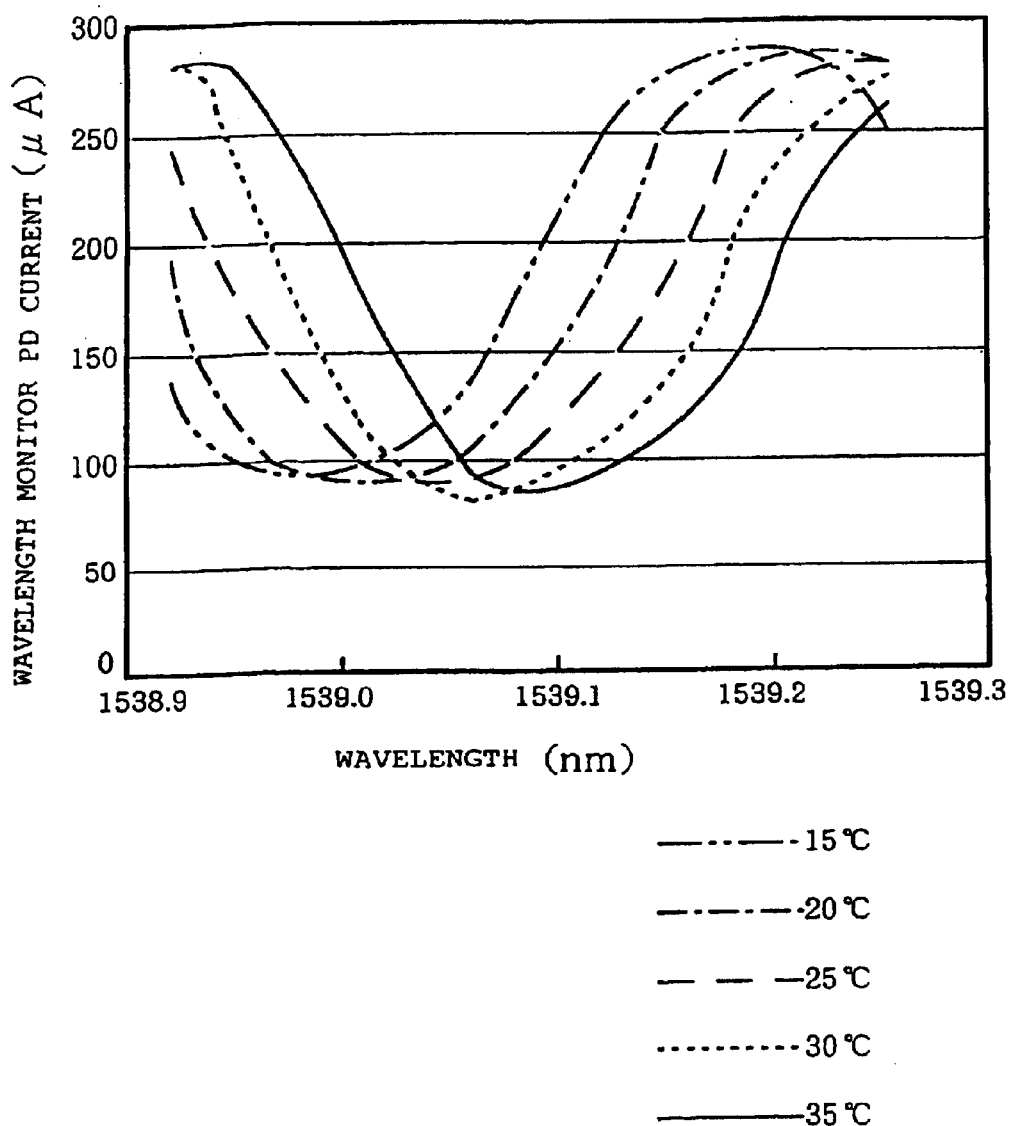
FIG. 20 is a graph showing the temperature characteristic of the optical filter.

By the way, the optical filter is, for instance, made of quartz and has temperature dependency (hereinafter simply referred to as the "temperature characteristic") in its light transmission characteristic, as shown in FIG. 20. For instance, the wavelength-light transmittance characteristic of an optical filter is shifted to a short wave side at a ratio of 0.01 nm per degree centigrade.

Figure 21:
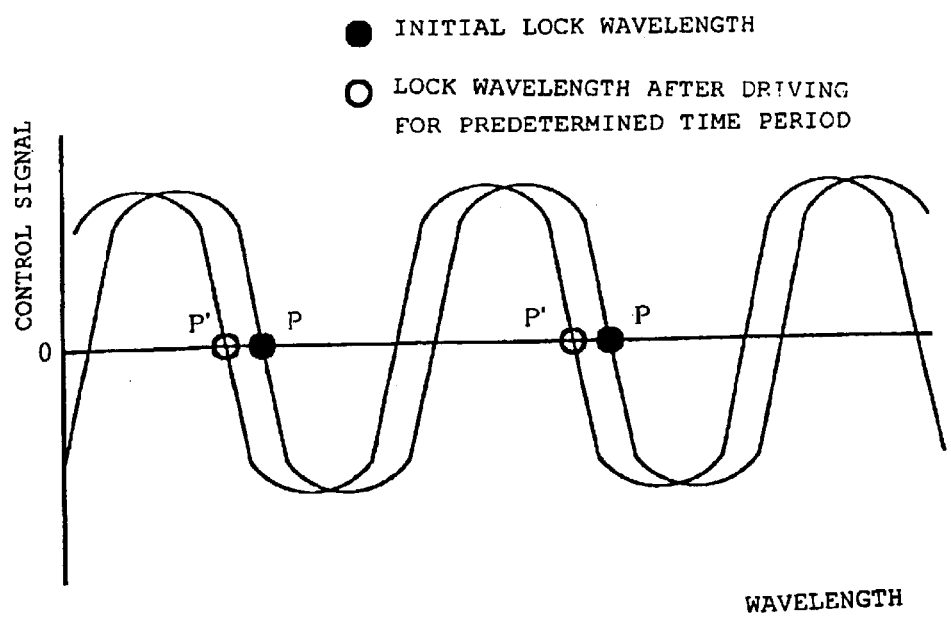
FIG. 21 is a graph illustrating wavelength shift caused by a change of the temperature of the optical filter.
Figure 22:
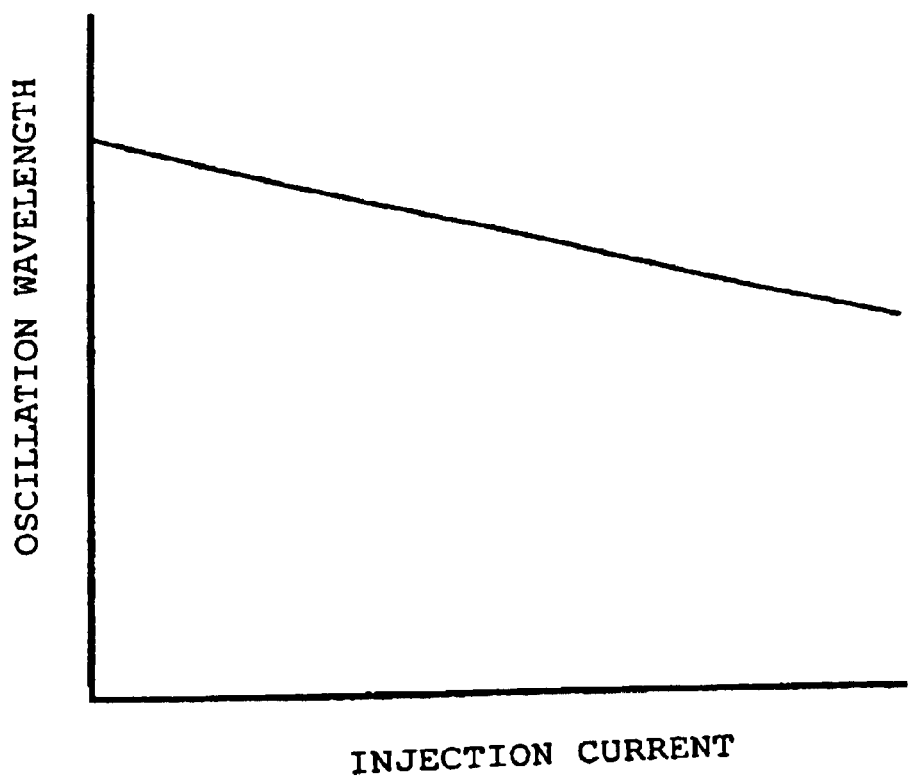
FIG. 22 is a graph showing a relation between an injection current and a wavelength when a wavelength monitor is driven.

In the conventional optical module, as shown in FIG. 15, for instance, the light-emitting device 50 and the optical filter 52 are thermally connected to each other in order to maintain approximately the same temperature. Accordingly, if the temperature of the LD carrier 60, on which the light-emitting device 50 is mounted, is lowered, the temperature of the optical filter 52 is also lowered and there occurs a change of the characteristic of the optical filter 52. That is, when the light-emitting device 50 deteriorates with time because a predetermined time period has passed since the start of driving of the wavelength monitor, the injection current injected into the light-emitting device 50 is increased and the temperature of the light-emitting device 50 is raised. In order to correct wavelength shift due to this phenomenon, the control unit 57 controls the Peltier module 56 so that the temperature of the light-emitting device 50 is lowered and the temperature of the optical filter 52 is lowered accordingly. As a result of the lowering of the temperature of the optical filter, it becomes impossible to obtain the initial wavelength characteristic and the optical filter characteristic is shifted to the short wave side as a whole, as shown in FIG. 21. In FIG. 21, a mark "●" represents the initial lock wavelength P and a mark "○" represents the lock wavelength P' after the driving for the predetermined time period. As described above, the lock wavelength is shifted from P to P' and it becomes impossible to obtain light having a desired wavelength. In the case where the wavelength monitor is driven, there exists a relation shown in FIG. 22 between the injection current and the wavelength, which means that the lasing wavelength has current dependency.

Figure 23:
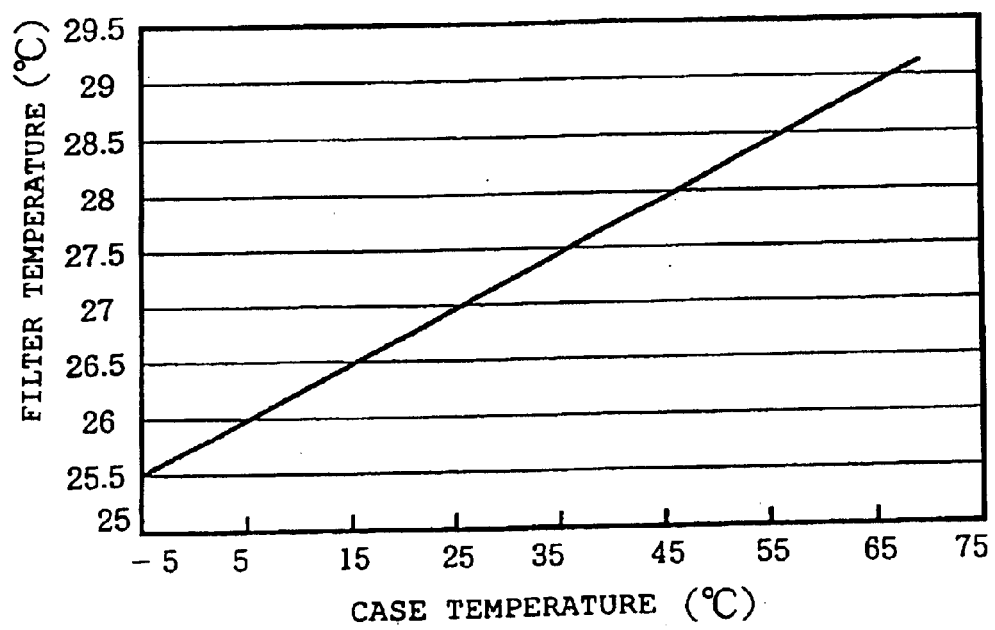
FIG. 23 is a graph showing a relation between a case temperature and a filter temperature.

Also, even in the case where the Peltier module 56, in which the optical filter is mounted, is controlled to have a fixed temperature, the temperature within the optical module fluctuates in accordance with a change of the external environmental temperature and the amount of power consumed by the optical module. Consequently, there is exerted an influence of a fluctuation of the environmental temperature from a side of the optical filter that does not directly contact the Peltier module. As a result, the temperature of the optical filter fluctuates in the manner shown in FIG. 23, for instance.

Wavelength shift caused by such a change of the temperature of the optical filter becomes a cause of the degradation of a signal due to crosstalk and therefore is not preferable for a dense WMD system in which there is required to stabilize a wavelength.

Figure 24:
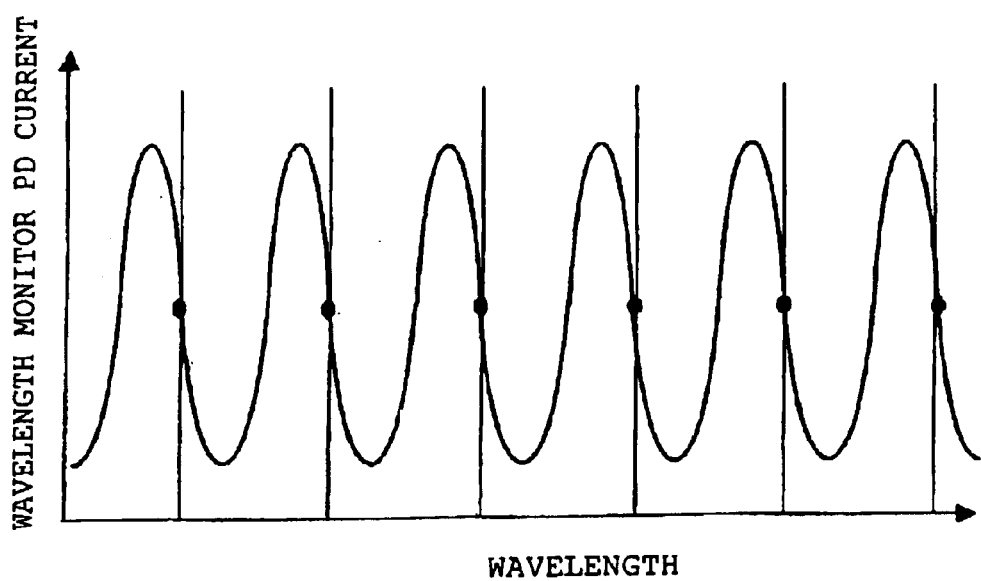
FIG. 24 is a graph showing the wavelength discrimination characteristic of the optical filter (etalon filter)

Also, in the dense WMD system, the wavelength spacing between optical signals are narrow, so that it is stringently demanded to prevent wavelength shift at each optical signal wavelength and it is required to fix a lasing wavelength with high precision. For instance, in the case where optical signals are arranged using an etalon filter having a wavelength discrimination characteristic shown in FIG. 24 as an optical filter, in order to make it possible to arrange the optical signals at constant wavelength spacing, the etalon filter is formed so that the center portion of each slope overlaps a predetermined wavelength.

By the way, in JP 2001-44558 A, for instance, there is proposed a technique with which the temperature of an etalon is detected, a correction signal is sent to a control unit by a correction unit, and there is performed temperature correction. In general, the etalon filter has a temperature characteristic. Among materials used for the etalon, crystal has a small temperature characteristic and is used with the technique disclosed in the document described above. Here, it is known that the temperature characteristic of a crystal etalon is 5 pm per degree centigrade.

It has conventionally been required that it is guaranteed that the case temperature of a package applied to an optical module remains within a range of from 5 to 70 degrees centigrade. Accordingly, a drift degree becomes "5 pm per degree centigrade×75 degrees centigrade=375 pm" due to the temperature of the etalon.

Also, in the case where the adjustment temperature of a temperature adjustment device, on which the optical filter is mounted, fluctuates, the drift degree due to the fluctuation of the temperature of the etalon is further increased.

Figure 25:
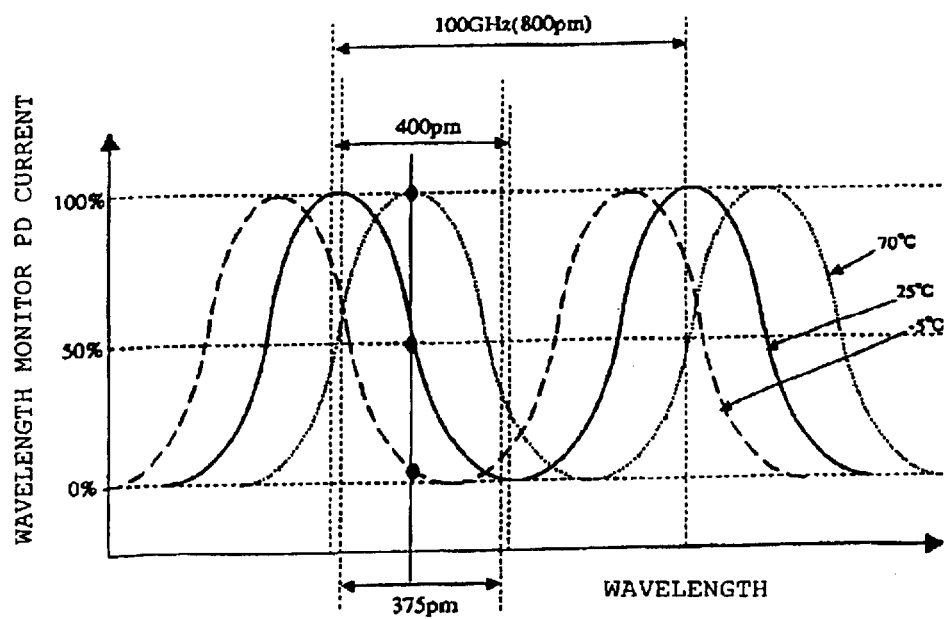
FIG. 25 is a graph showing a relation between a wavelength and a wavelength monitor PD current for illustrating problems of a conventional technique.

If the wavelength locking is performed using a crystal etalon with intervals of 100 GHz (800 pm) and there is performed temperature compensation as shown in FIG. 25, for instance, the locked wavelength and the locking point on a slope are expressed as a relation shown in the drawing. By performing the temperature compensation, the locked wavelength and the locking point on the slope actively move on the slope.

On the other hand, in the field of WMD (in particular, in the field of dense WMD), there is required a laser module having a very large number of lasing wavelengths that differ from each other. However, it is not realistic to produce a laser having wavelengths of all of these kinds using different specifications, and it is preferable that one laser module is formed so as to be adjustable to several required wavelengths and to have a characteristic with which it is possible to cope with at least two wavelengths. In order to realize such wavelength adjustment, it is effective that the optical filter used in the wavelength monitor unit is made of an etalon or the like whose wavelength transmission characteristic has repetition periods for the required wavelength of laser light.

It is impossible, however, to distinguish a wavelength, in proximity to which the lasing wavelength of a laser exists, of the repetition periods of the wavelength transmission characteristic of the optical filter using a signal from a wavelength monitor.

Accordingly, it is required to control beforehand a laser lasing wavelength to fall within a certain wavelength range in which it is possible to perform adjustment using the wavelength monitor. In order to perform the lasing wavelength control through the control of a temperature adjustment device, on which the light-emitting device is mounted, it is required to measure and control the temperature of the light-emitting device with precision. Consequently, it is required to arrange a temperature detection unit in proximity to the light-emitting device.

The temperature in proximity to the light-emitting device fluctuates due to the current injected into the light-emitting device or the like. Also, there exists a temperature distribution because there exists a spatial distance between the light-emitting device and the optical filter even if they are arranged within the same package or on the same temperature adjustment device. Accordingly, it is extremely difficult to perform compensation by measuring the temperature of the optical filter with the same temperature detection unit.

Assuming that a lock point exists at the center of a slope if the temperature of an etalon is 32.5 degrees centigrade that is the intermediate temperature, the lock point exists at a position, at which the inclination of the slope is eased in the lower portion of the slope, if the temperature of the etalon becomes −5 degrees centigrade, and the lock point exists at a position, at which there is obtained the maximum value of the light-receiving device, if the temperature becomes −70 degrees centigrade. The wavelength locking is performed to detect to which side the wavelength is shifted using the slope. Accordingly, on the low temperature side and the high temperature side described here, sufficient locking becomes impossible and, in particular, the wavelength shifts to a neighboring slope by exceeding the peek of the wavelength discrimination characteristic. Accordingly, it becomes impossible to perform the wavelength locking by performing temperature compensation for an etalon filter with short periods that is used in a dense WMD system like this. Needless to say, if the wavelength spacing are narrowed from 50 GHz, through 25 GHz, to 12.5 GHz in order to improve a transmission capacity, a range, in which it is possible to perform the locking, becomes apparently narrower than a range of 345 pm, in which it is possible to perform temperature compensation. Consequently, it becomes impossible to perform the wavelength locking.

As described above, in the dense WMD system with narrow wavelength spacing, it is required to suppress wavelength shift to a level of several pm or lower and it has been impossible to meet such a demand with a conventional optical module or optical transmitter where there occurs wavelength shift of at least 10 pm due to only the dependency on a case temperature.

Also, the temperature of the optical module is controlled only from the bottom surface side, so that there occurs temperature distribution for each component. In particular, the transmission wavelength characteristic of the etalon filter is determined by the filter length in the optical-axis direction and there is required an incident area that is at least equal to the optical diameter of incident light. This means that it is required that the etalon filter has a size that is at least equal to 1 mm.

Also, the etalon filter has a small heat conductivity in comparison with a metal and, in the case of an etalon filter using crystal, the heat conductivity in the optical-axis direction becomes 0.0255 Cal/cm·sec·deg, although the heat conductivity in a direction vertical to the optical axis (that is, in a direction vertical to the adjustment surface of the temperature adjustment device) is reduced to 0.0148 Cal/cm·sec·deg and therefore it is difficult to control the temperature adjustment device and there tends to occur temperature distribution in comparison with another component such as the light-emitting device.

In view of these problems, the inventor of the present invention has devised a technique with which a lasing wavelength is stabilized by additionally providing a temperature detection unit for detecting the temperature of an optical filter separately from a temperature detection unit that detects the temperature of a light-emitting device and by correcting wavelength shift caused by the temperature characteristic of the optical filter.

However, if the temperature detection unit that detects the temperature of the optical filter is additionally provided as a separate component, this increases the number of components and the number of wiring, which results in the complication of the construction of an optical module and an increase in cost.

To circumvent this problem, in the embodiments of the present invention, by utilizing a fact that a correlation exists between the temperature characteristic of the light-emitting device and the temperature characteristic of the optical filter, there are provided a method of controlling a wavelength of a semiconductor laser, an optical module, an optical transmitter, and a WMD optical transmission apparatus that are each capable of stabilizing the lasing wavelength of laser light with high precision by estimating the temperature of an optical filter using a detected temperature of the light-emitting device and by correcting wavelength shift caused by the temperature characteristic of the optical filter based on the estimated temperature of the optical filter.

First Embodiment

Figure 1:
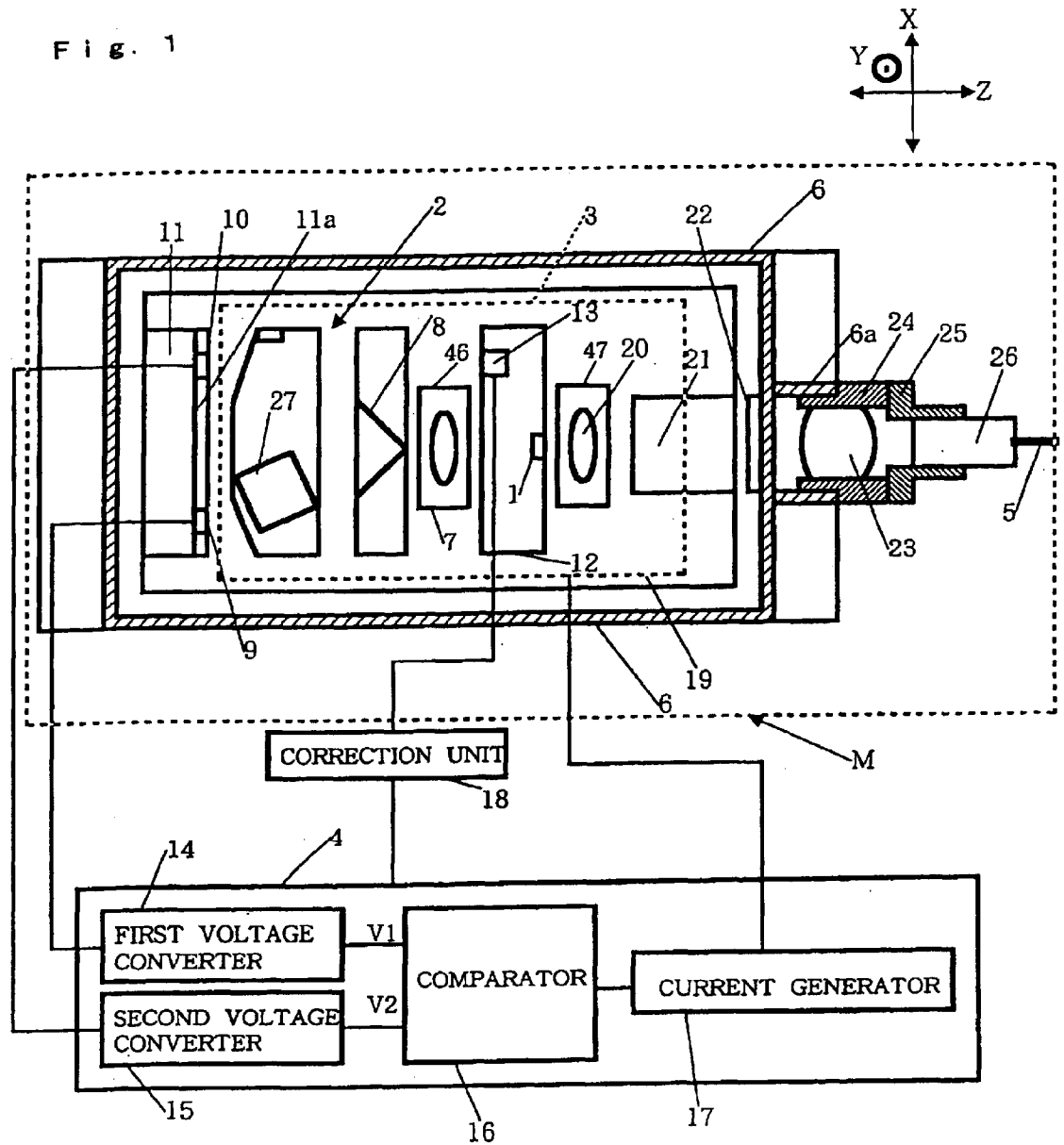
FIG. 1 is a plane cross-sectional view illustrating an optical transmitter according to a first embodiment of the present invention.
Figure 2:
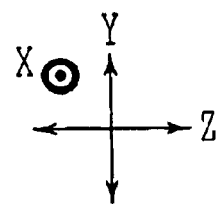
FIG. 2 is a side cross-sectional view illustrating the optical transmitter according to the first embodiment of the present invention.
Figure 2:
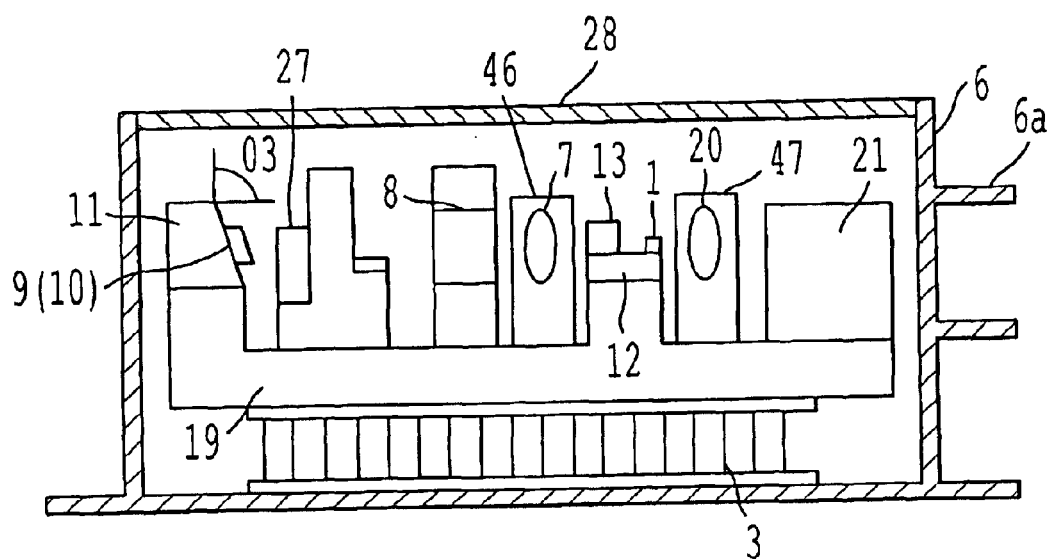

FIG. 1 is a plane cross-sectional view illustrating an optical transmitter according to a first embodiment of the present invention, while FIG. 2 is a side cross-sectional view thereof.

As shown in FIGS. 1 and 2, the optical transmitter according to the first embodiment of the present invention includes: a light-emitting device 1, such as a semiconductor laser diode, that outputs laser light; a wavelength monitor unit 2 that receives laser light for monitoring outputted from the back-side (left-side in FIG. 1) end surface among laser light outputted from the light-emitting device 1; a temperature adjustment unit 3, such as a Peltier device, that controls the temperature of the light-emitting device 1; a control unit 4 that controls the adjustment temperature of the temperature adjustment unit 3 so that the lasing wavelength of laser light emitted from the light-emitting device 1 is fixed at a predetermined wavelength, based on a signal outputted from the wavelength monitor unit 2; an optical fiber 5 that is struck by laser light outputted from the front-side (right-side in FIG. 1) end surface of the light-emitting device 1 and sends the laser light to the outside; and a package 6 that hermetically seals the inside.

Here, an optical module M is constructed by a portion surrounded by the dotted line in FIG. 1 that includes the light-emitting device 1, the wavelength monitor unit 2, the temperature adjustment unit 3, and the optical fiber 5.

Figure 3:
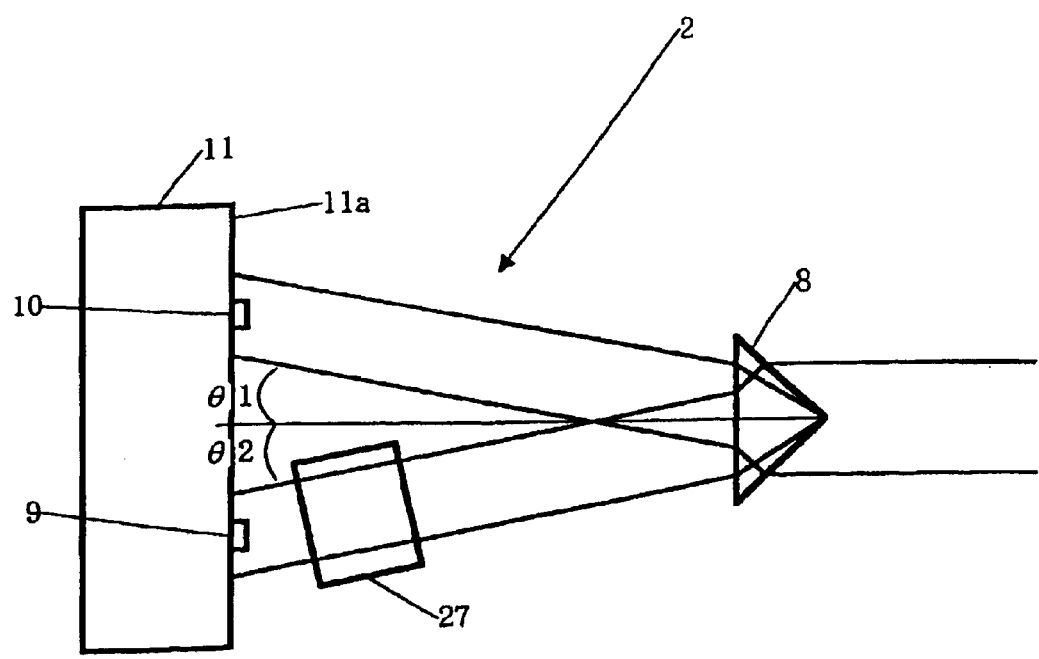
FIG. 3 is an explanatory drawing showing a construction of a wavelength monitor unit.

The wavelength monitor unit 2 is arranged within the package 6 that hermetically seals the light-emitting device 1. FIG. 3 is an explanatory drawing showing the construction of the wavelength monitor unit 2. As shown in FIG. 3, the wavelength monitor unit 2 includes: a prism 8 that divides laser light, which was outputted from the back-side end surface of the light-emitting device 1 and was converted into parallel light by a collimating lens 7, into two laser lights; a first light-receiving device 9, such as a photodiode, that receives one of the two laser lights divided by the prism 8; a second light-receiving device 10, such as a photodiode, that receives the other of the two laser lights divided by the prism 8; and an optical filter 27 that is arranged between the prism 8 and the first light-receiving device 9. The first light-receiving device 9 and the second light-receiving device 10 are fixed on the same plane (on the same attaching surface 11a, in this embodiment) of a PD carrier 11.

The attaching surface 11a of the PD carrier 11, on which there are fixed the first photodiode 10 and the second photodiode 11, is inclined with reference to the incident direction of the laser light at an angle of θ3 that exceeds 90° (see FIG. 2).

The entire surface of the prism 8 is coated with an AR (Anti-Reflection) film in order to suppress the reflection of laser light. It is preferable that the inclination angles θ1 and θ2 of laser light divedeed by the prism 8 are approximately the same angle (in a range of from 15° to 45°, for instance). This is because it becomes easy to determine the light-receiving positions of the first light-receiving device 9 and the second light-receiving device 10.

The optical filter 27 has periodicity in its wavelength-transmission light intensity characteristic and there is, for instance, used a Fabry-Perot etalon, a dielectric multi-layered film filter, or the like whose wavelength spacing between respective periods is 100 GHz or shorter.

The light-emitting device 1 is fixed on an LD carrier 12. On the LD carrier 12, there is also provided a temperature detection unit 13, such as a thermistor, that detects the temperature of the light-emitting device 1.

Also, the LD carrier 12 and the wavelength monitor unit 2 are fixed on a base 19. Accordingly, the light-emitting device 1 and the optical filter 27 are thermally connected to each other and the temperature of the optical filter 27 is changed in accordance with a change of the temperature of the light-emitting device 1 by the temperature adjustment unit 3.

The control unit 4 controls the temperature detected by the temperature detection unit 13 using the temperature adjustment unit 3 based on a voltage difference or voltage ratio between two inputted PD currents so that the wavelength of light emitted from the light-emitting device 1 becomes constant.

The control unit 4 includes: a first voltage converter 14 that converts a first PD current outputted from the first light-receiving device 9 into a first voltage V1; a second voltage converter 15 that converts a second PD current outputted from the second light-receiving device 10 into a second voltage V2; a comparator 16 that outputs a voltage difference or voltage ratio between the first voltage V1 outputted from the first voltage converter 14 and the second voltage V2 outputted from the second voltage converter 15 as a control signal; and a current generator 17 that outputs a temperature control current for controlling the adjustment temperature of the temperature adjustment unit 3 in accordance with the control signal outputted from the comparator 16. Note that an amplifier (not shown) that amplifies the first voltage V1 outputted from the first voltage converter 14 and the second voltage V2 outputted from the second voltage converter 15 may be provided so as to precede the comparator 16.

Also, the temperature detection unit 13 is connected to a correction unit 18. This correction unit 18 estimates the temperature of the optical filter 27 based on the temperature detected by the temperature detection unit 13 and outputs, to the comparator 16 of the control unit 4, a correction signal that commands the correction of wavelength shift caused by the temperature characteristic of the optical filter 27 based on the estimated temperature of the optical filter 27.

Here, there will be described a correlation between the temperature of the light-emitting device 1 and the temperature of the optical filter 27 and the estimation of the temperature of the optical filter.

Figure 4:
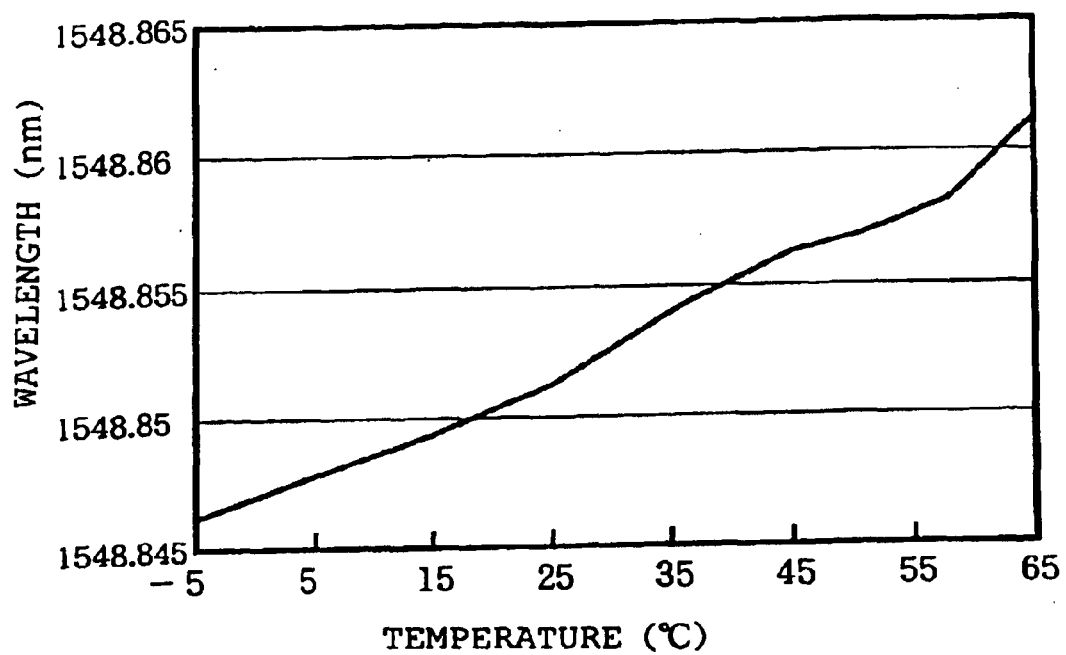
FIG. 4 is a graph showing a relation between the wavelength and temperature of the wavelength monitor unit.
Figure 5:
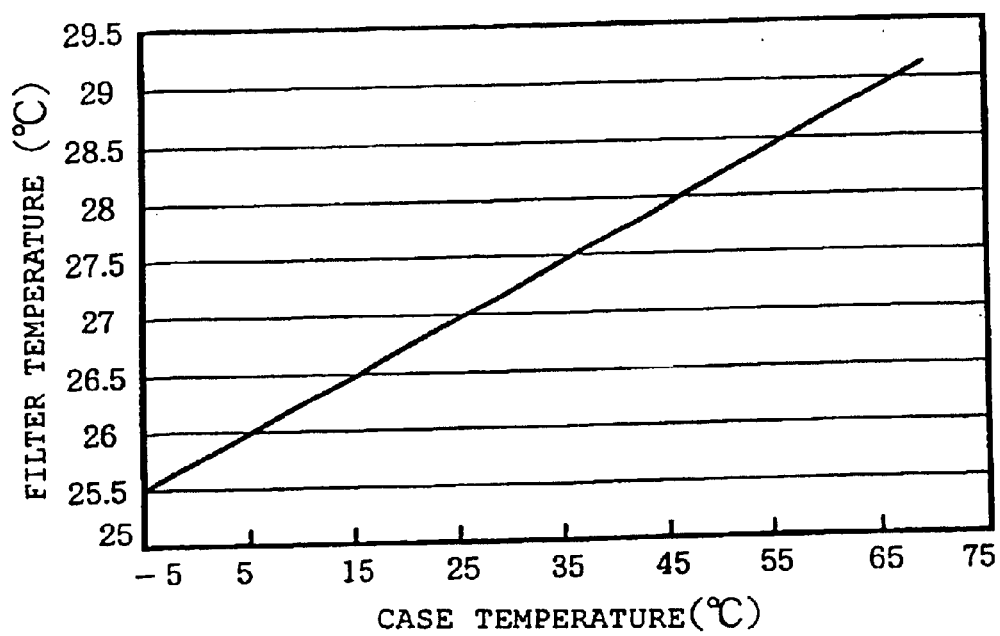
FIG. 5 is a graph showing a relation between a case temperature and a filter temperature.

As shown in FIG. 4, when the lasing wavelength is locked based on a signal from the wavelength monitor unit 2, the wavelength has case temperature dependency because heat is conducted to the optical filter 27 through the heat radiation from the package 6. Also, a correlation exists between the case temperature and the optical filter as shown in FIG. 5 and the temperature of the optical filter is proportional to the case temperature.

Figure 6:
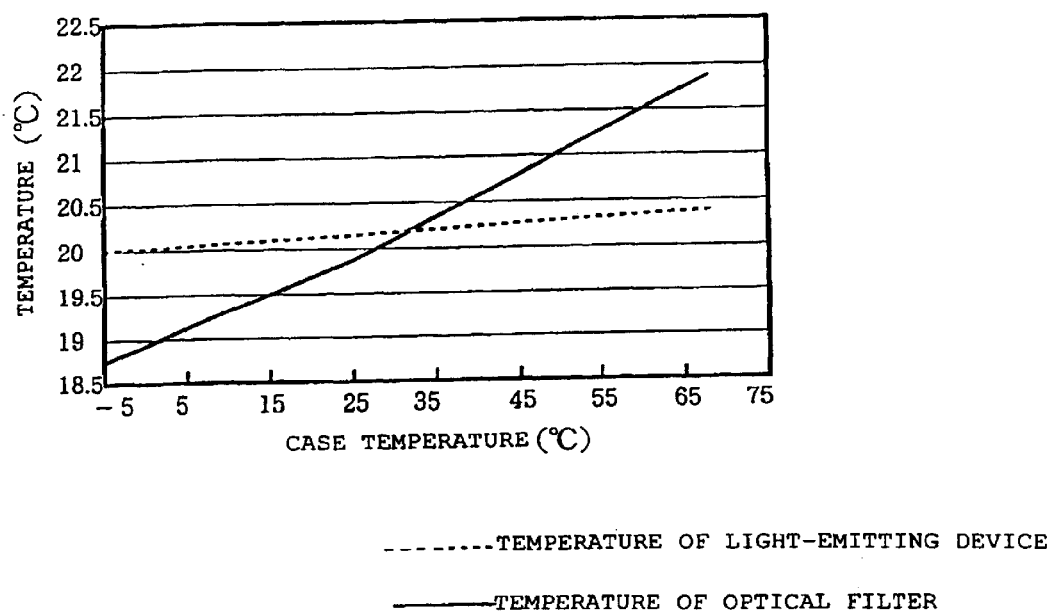
FIG. 6 is a graph showing a correlation between the temperature of a light-emitting device and the temperature of an optical filter with reference to the case temperature.

By the way, when the case temperature is changed, the temperature of the temperature adjustment unit 3 is controlled so that the optical output and lasing wavelength of the light-emitting device 1 are fixed. For instance, in the case where the light-emitting wavelength is fixed at 1548.515 nm that is an ITU wavelength, the output of the optical fiber is fixed at 20 mW, and there are detected the case temperatures and the temperatures of the LD carrier 12 and the optical filter 27 by attaching a temperature detection device (thermistor, for instance) thereto, to thereby obtain a relation shown in FIG. 6. In FIG. 6, the dotted line represents the temperature of the light-emitting device and the solid line represents the temperature of the optical filter. As can be seen from FIG. 6, the temperature of the LD carrier 12 and the temperature of the optical filter 27 are both raised toward the right side (although the inclinations (gradients) thereof differ from each other) and there exists a correlation between these temperatures.

Figure 7:
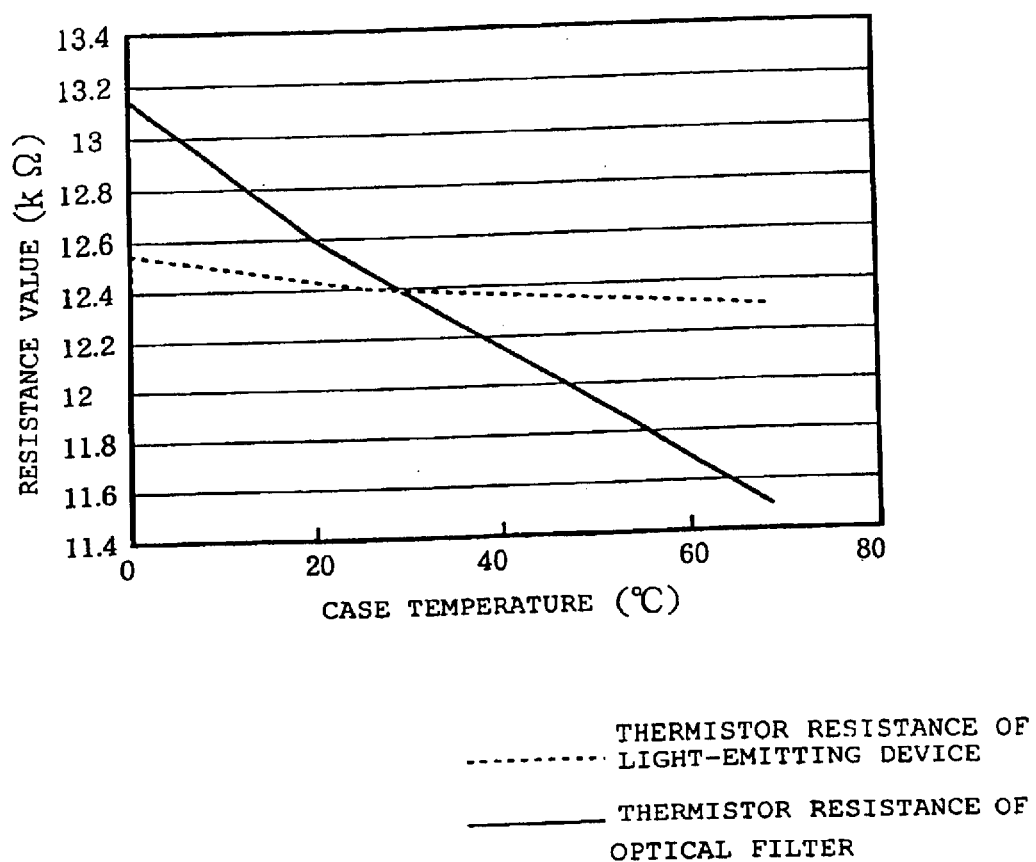
FIG. 7 is a graph showing a correlation between the thermistor resistance of the light-emitting device and the thermistor resistance of the optical filter with reference to the case temperature.

Also, FIG. 7 is a graph showing a correlation between the thermistor resistance of the light-emitting device and the thermistor resistance of the optical filter with reference to the case temperature. In FIG. 7, the dotted line indicates the thermistor resistance of the light-emitting device and the solid line indicates the thermistor resistance of the optical filter.

As shown in FIG. 7, the thermistor resistance on the LD carrier 12 and the thermistor resistance of the optical filter 27 are both decreased toward the right side (although the inclinations (gradients) thereof differ from each other) and there exists a correlation between these resistances. Accordingly, it is possible to estimate the temperature of the optical filter 27 by detecting the temperature of the LD carrier 12.

Figure 8:
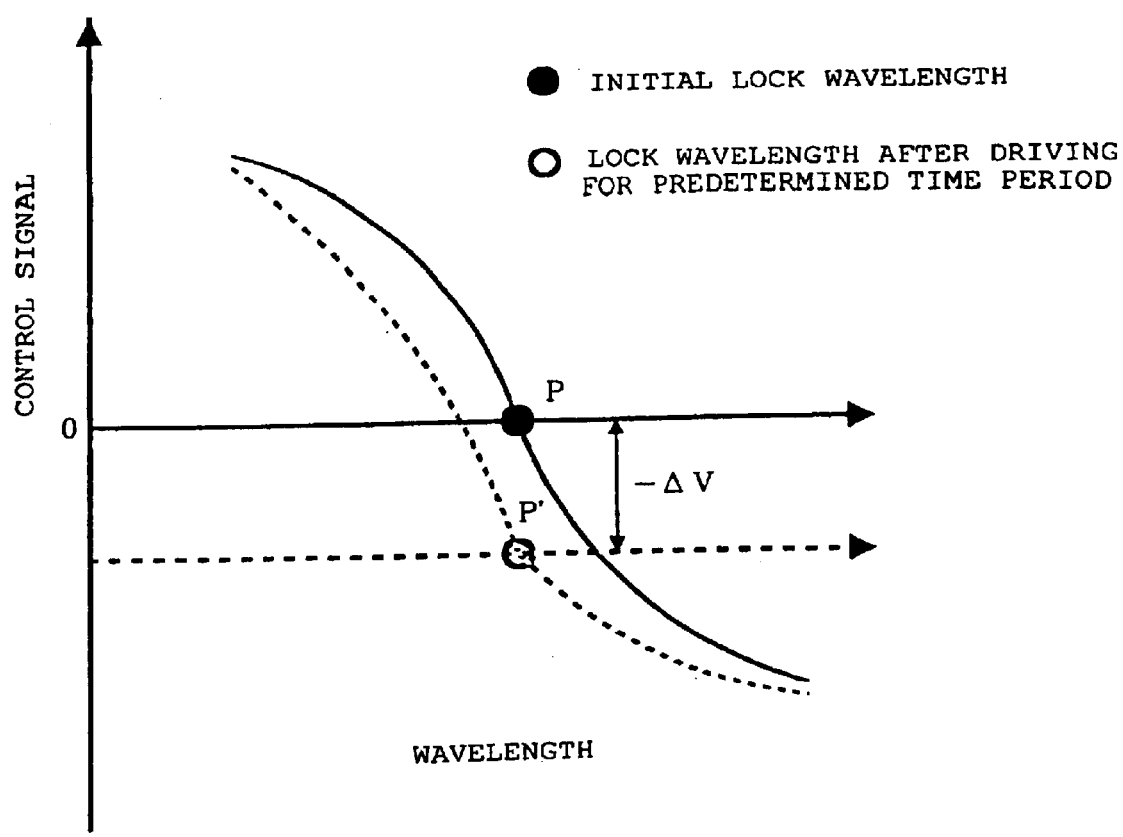
FIG. 8 is a graph illustrating a method of correcting wavelength shift.

The correction unit 18 corrects wavelength shift due to the temperature characteristic of the optical filter 27 by inputting a predetermined voltage corresponding to the temperature of the optical filter 27 into the comparator 16 of the control unit 4 and by offsetting the voltage of a control signal by a degree corresponding to the inputted voltage. For instance, as shown in FIG. 8, after driving is performed for a predetermined time period from an initial state, the wavelength characteristic is shifted to the short wavelength side due to the temperature characteristic of the optical filter 27. In order to maintain an initial wavelength, first, there is obtained the temperature characteristic of the optical filter 27 in advance. The correction unit 18 estimates the temperature of the optical filter 27 based on the temperature of the light-emitting device 1 detected by the temperature detection unit 13, outputs an appropriate correction voltage in accordance with a change of the estimated temperature of the optical filter, and performs feedback to the comparator 16 of the control unit 4. The point of "0 V" of the control voltage signal is offset by a correction voltage. In FIG. 8, when the wavelength characteristic is shifted from the 0 V point under the initial state due to a change of the temperature of the optical filter 27 after the driving for a predetermined time period, this temperature change is detected and there is outputted a voltage $\Delta V$ corresponding to the degree of the temperature change. By doing so, a point, which is lowered from the 0 V point under the initial state by $\Delta V$, returns to a 0 V point. The wavelength is locked at the 0 V point in this manner, so that it becomes possible to perform the wavelength locking with stability without generating any change from the wavelength under the initial state.

The voltage value applied to the offset may be preset by measuring optimum voltage values for two temperatures and by performing linear calculation based on the voltage values or may be read from a database in which there is stored an optimum offset voltage value for each temperature.

On the front side (right side in FIG. 1) of the light-emitting device 1, there is provided a collimating lens 20 that converts laser light outputted from the front-side end surface thereof into parallel light. Also, on the front side of the collimating lens 20, there is provided an optical isolator 21 that cuts off light returning to the light-emitting device 1. This optical isolator 21 is a well-known optical isolator that is constructed, for instance, by combining a polarizer with a Faraday rotator.

Within a flange portion 6a formed in a side portion of the package 6, there are provided a window portion 22, on which light having passed through the optical isolator 21 is incident, and a condensing lens (second lens) 23 that condenses laser light on an end surface of the optical fiber 5. The condensing lens 23 is held by a lens holder 24 fixed to an end portion of the flange portion 6a by YAG laser welding and a metallic slide ring 25 is fixed to an end portion of the lens holder 24 by YAG laser welding.

The optical fiber 5 is held by a ferrule 26 and this ferrule 26 is fixed inside the slide ring 25 by YAG laser welding.

A lid portion 28 (see FIG. 2) is put on the upper portion of the package 1 and the outer edge thereof is subjected to resistance welding, thereby hermetically sealing the inside of the package 6.

It should be noted here that the collimating lenses 7 and 20 are held by a first lens holder 46 and a second lens holder 47, respectively.

Laser light outputted from the front-side end surface of the light-emitting device 1 is converted into parallel light by the collimating lens 20, is condensed by the condensing lens 23 through the optical isolator 21 and the window portion 22, is incident on the optical fiber 5, and is sent to the outside.

On the other hand, laser light outputted from a back-side end surface of the light-emitting device 1 is converted into parallel light by the collimating lens 7 and is divedeed in two directions by the prism 8. One of the divedeed laser light is received by the first light-receiving device 9 through the optical filter 27, while the other of the divedeed laser light is received by the second light-receiving device 10. The first PD current and the second PD current outputted from the first light-receiving device 9 and the second light-receiving device 10 are inputted into the control unit 4.

The control unit 4 converts the first PD current into a first voltage V1 using the first voltage converter 14, converts the second PD current into a second voltage V2 using the second voltage converter 15, and outputs a voltage difference or voltage ratio between the first voltage V1 and the second voltage V2 as a control signal using the comparator 16. The control signal outputted from the comparator 16 is inputted into the current generator 17. This current generator 17 selectively outputs a temperature control current for raising or lowering the temperature of the temperature adjustment unit 3 based on the control signal from the comparator 16. By doing so, it becomes possible to perform control so that the lasing wavelength of laser light outputted from the light-emitting device 1 becomes a desired wavelength.

Also, the correction unit 18 estimates the temperature of the optical filter 27 based on the temperature of the light-emitting device 1 detected by the temperature detection unit 13, and outputs, to the control unit 4, a correction signal commanding the correction of wavelength shift caused by the temperature characteristic of the optical filter 27 based on the estimated temperature of the optical filter 27. Accordingly, it becomes possible to stabilize the lasing wavelength of laser light with precision. As a result, it becomes possible to provide an optical module and an optical transmitter that are capable of reducing the signal degradation of an optical signal and are high in reliability.

It should be noted here that in order to drive the wavelength locking, it is required that the lasing wavelength of the light-emitting device 1 falls within a predetermined range of a wavelength discrimination curve.

Figure 9:
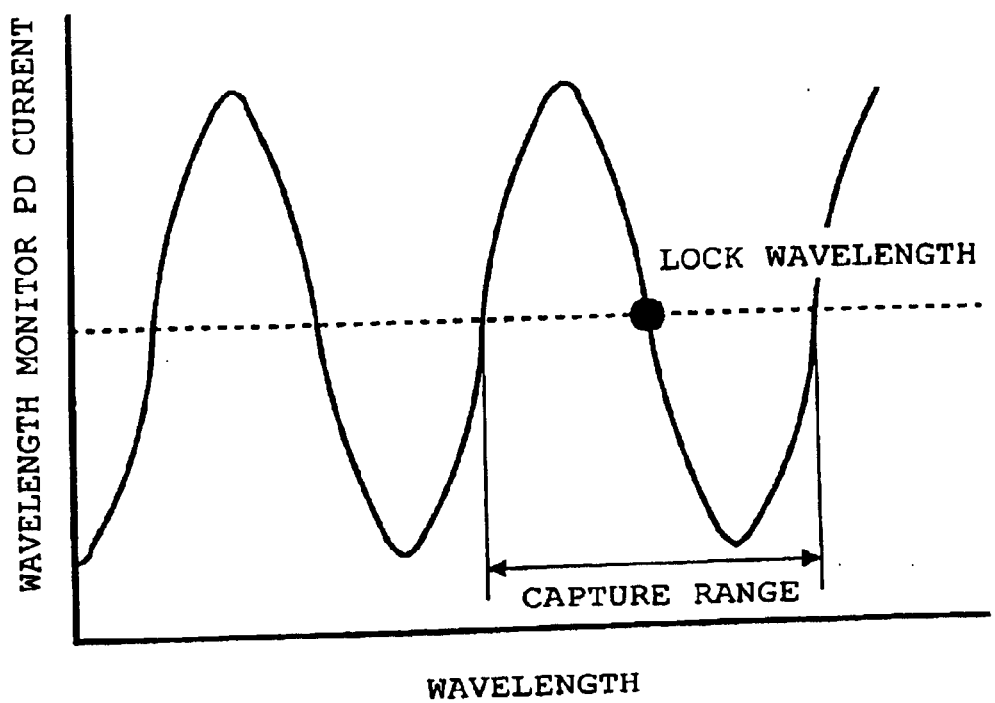
FIG. 9 is a graph showing a wavelength discrimination curve.

FIG. 9 is a graph showing the wavelength discrimination curve. In FIG. 9, the black plot on the wavelength discrimination curve represents a wavelength at which the locking is performed. In order to drive this wavelength locking, it is required that the wavelength exists within the illustrated capture range prior to the wavelength locking driving. To do so, it is required to perform ATC driving that controls the temperature adjustment unit 3 constructed using a Peltier module by detecting the temperature of the light-emitting device 1. To do so, it is required to use the temperature detection unit 13 that detects the temperature of the light-emitting device 1.

Next, there will be described a procedure for controlling the wavelength locking. First, a current is injected into the light-emitting device 1 by an ACC circuit or an APC circuit, the temperature of the light-emitting device 1 is detected by the temperature detection unit 13, and temperature control is performed by controlling the temperature adjustment unit 3 using the ATC circuit. The ATC circuit compares the detected temperature with a reference temperature and performs control so that a difference therebetween becomes zero. Accordingly, it becomes possible to control a lasing wavelength by controlling the reference temperature. The lasing wavelength is adjusted so as to fall within the capture range shown in FIG. 9 by controlling the reference temperature. After it is confirmed that the lasing wavelength falls within the capture range, there is performed switching to the wavelength locking, and temperature control is performed by the temperature adjustment unit 3 in accordance with a wavelength monitor signal in the manner described above.

By following this procedure for controlling the wavelength locking, the lasing wavelength is stabilized at the plotted locking point.

With the technique of the first embodiment of the present invention, by utilizing a fact that a correlation exists between the temperature characteristic of the light-emitting device 1 and the temperature characteristic of the optical filter 27, the temperature of the optical filter 27 is estimated by detecting the temperature of the light-emitting device 1 and wavelength shift caused by the temperature characteristic of the optical filter 27 is corrected based on the estimated temperature of the optical filter 27. Accordingly, it becomes possible to stabilize the lasing wavelength of laser light with precision for a long time period. As a result, it becomes possible to improve the reliability of the system.

Also, the temperature detection unit 3 that detects the temperature of the light-emitting device 1 is also arranged in a conventional optical module, so that it is possible to use this unit without changing the construction of the conventional optical module.

Further, it is not required to separately provide a temperature detection unit that detects the temperature of the optical filter 27, so that there is not increased the number of components and the number of wiring. As a result, it becomes possible to simplify the construction of the optical module and to realize the reduction in cost.

Figure 10:
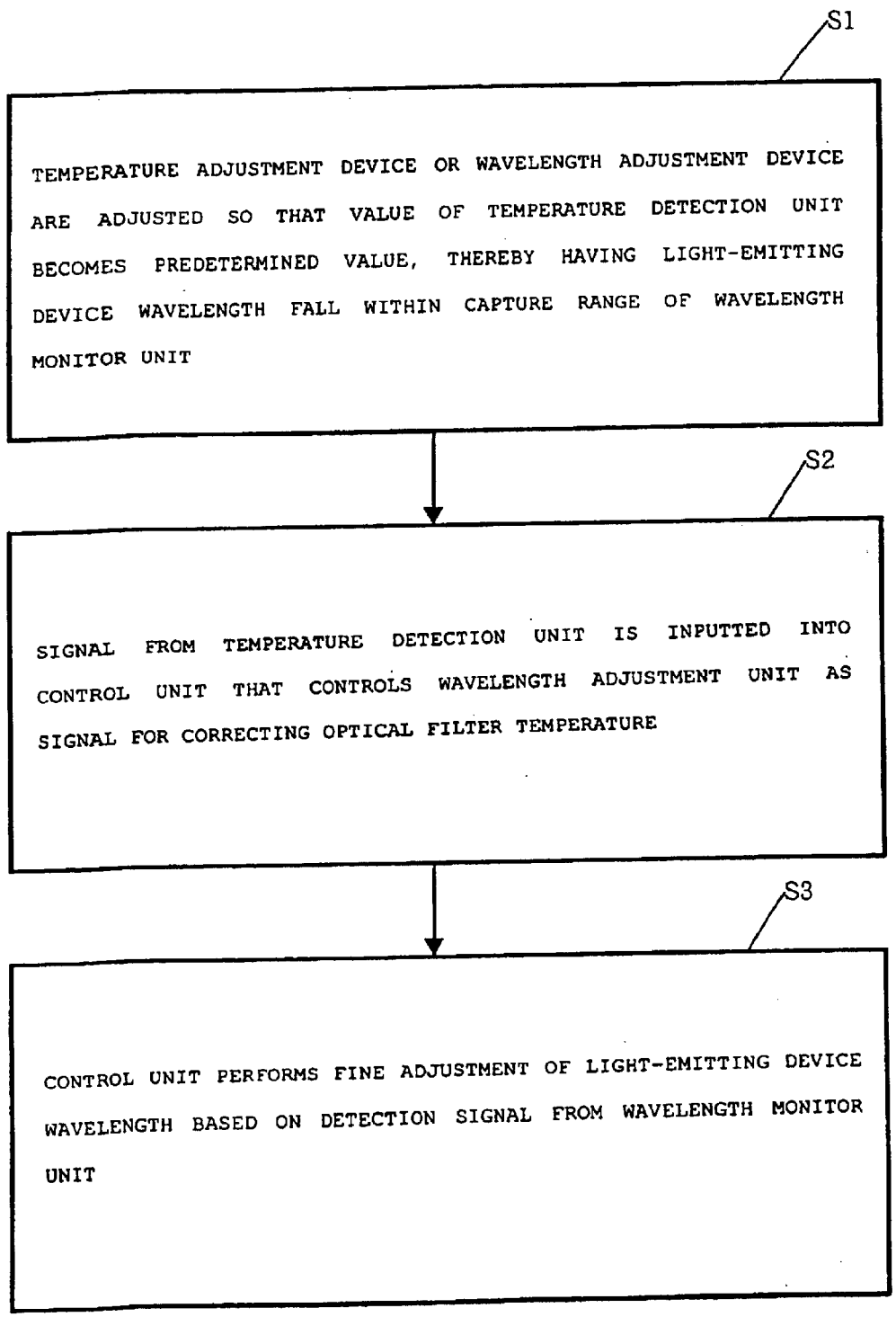
FIG. 10 is a flowchart illustrating a wavelength control method of an embodiment of the present invention.

FIG. 10 is a flowchart illustrating a wavelength control method of this embodiment of the present invention.

First, the temperature adjustment device 3 (or wavelength adjustment device) is adjusted so that a value detected by the temperature detection unit 13 becomes a predetermined value, thereby having the lasing wavelength of the light-emitting device 1 fall within the capture range of the wavelength monitor unit 2 (step S1).

Next, a signal from the temperature detection unit 13 is inputted into the control unit 4 that performs the control of the temperature adjustment device 3 (or wavelength adjustment device) as a signal for correcting the temperature of the optical filter (step S2).

Next, the control unit 4 finely adjusts the wavelength of the light-emitting device 1 based on the detection signal from the wavelength monitor unit 2 (step S3).

Here, a wavelength control method at the activation of a laser is used in step S1, while a wavelength control method under normal conditions is used in steps S2 and S3. There is performed switching between these wavelength control methods.

Second Embodiment

Figure 11:
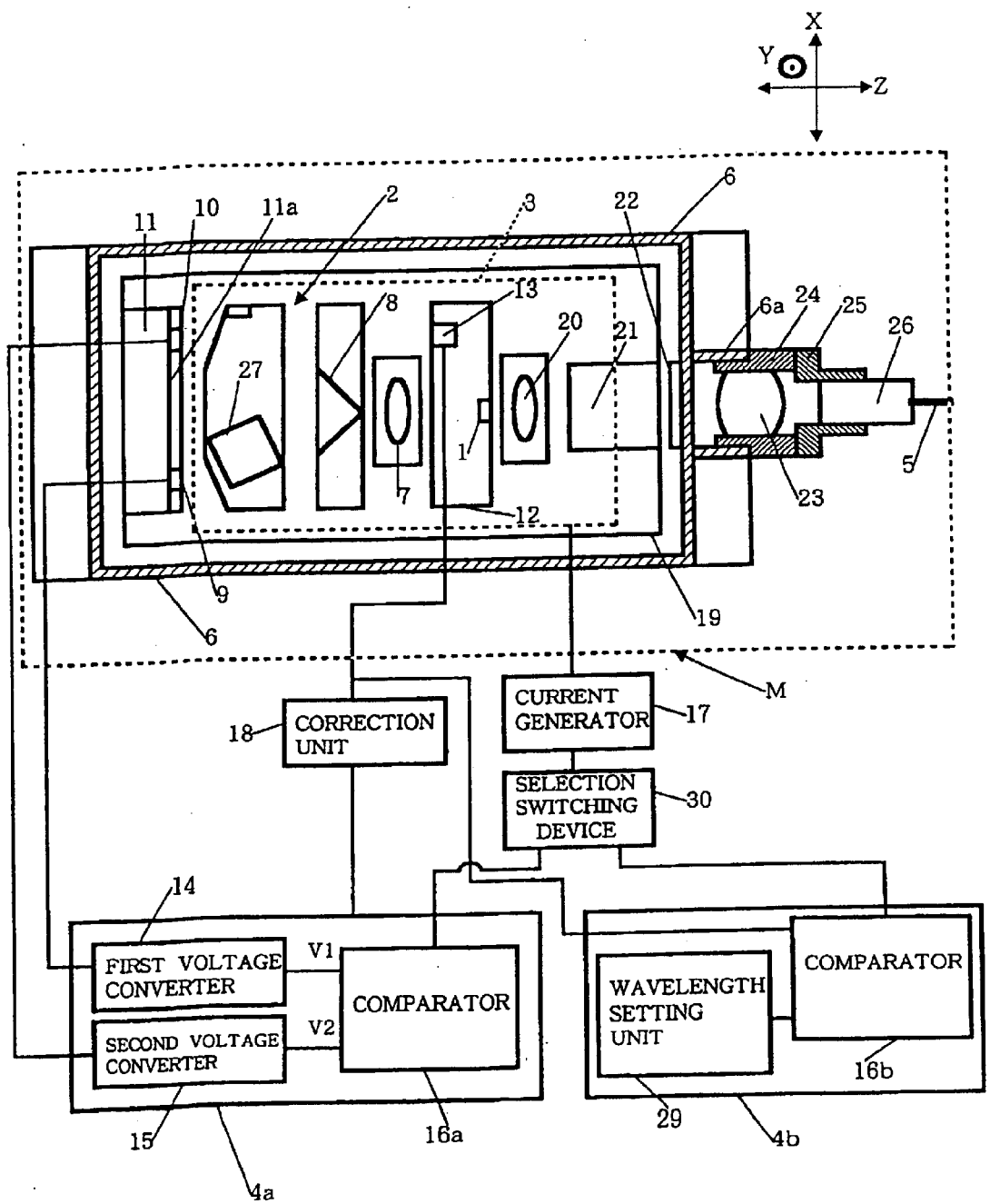
FIG. 11 is a block diagram showing a second embodiment of the present invention.

FIG. 11 is a block diagram showing a second embodiment of the present invention. In this embodiment of the present invention, during the process of a series of wavelength control shown in the flowchart in FIG. 10, the temperature control unit 13 is required to achieve a function of controlling the temperature of the light-emitting device 1 that differs from a function of correcting the temperature of the optical filter 27. In the second embodiment shown in FIG. 11, there will be described a construction where the temperature detection unit 13 achieves such a different function.

As shown in FIG. 11, in the second embodiment, there are used a first control unit 4a that performs the wavelength control under normal conditions and a second control unit 4b that performs the wavelength control at the activation of a laser. The first control unit 4a performs the wavelength control based on a signal from the wavelength monitor unit 2 and includes a first voltage converter 14, a second voltage converter 15, and a comparator 16a that outputs a voltage difference or voltage ratio between a first voltage V1 outputted from the first voltage converter 14 and a second voltage V2 outputted from the second voltage converter 15 as a control signal.

The second control unit 4b includes a wavelength setting unit 29 that stores a value set in accordance with a predetermined wavelength that is to be obtained and sets a reference value, and a comparator 16b that compares a signal from the wavelength setting unit 29 with a signal from the temperature detection unit 13.

Between a current generator 16 and the comparators 16a and 16b, there is provided a selection switching unit 30 that performs the switching of signal input from the first and second control units 4a and 4b to the current generator 17.

A signal from the temperature detection unit 13 is inputted into the correction unit 18 and the comparator 16b of the second control unit 4b. A correction signal from the correction unit 18 is inputted into the first control unit 4a.

The signal input from the first and second control units 4a and 4b into the current generator 17 is switched by the selection switching unit 30, the current value to the temperature adjustment device 3 is controlled, and there is performed the adjustment of the lasing wavelength. There may be used a function of, during this operation, selecting a signal from the second control unit 4b when a laser is activated and of performing automatic switching when the value from the control unit 4b becomes equal to or lower than a fixed value because the lasing wavelength is adjusted so as to fall within the capture range.

Third Embodiment

Figure 12:
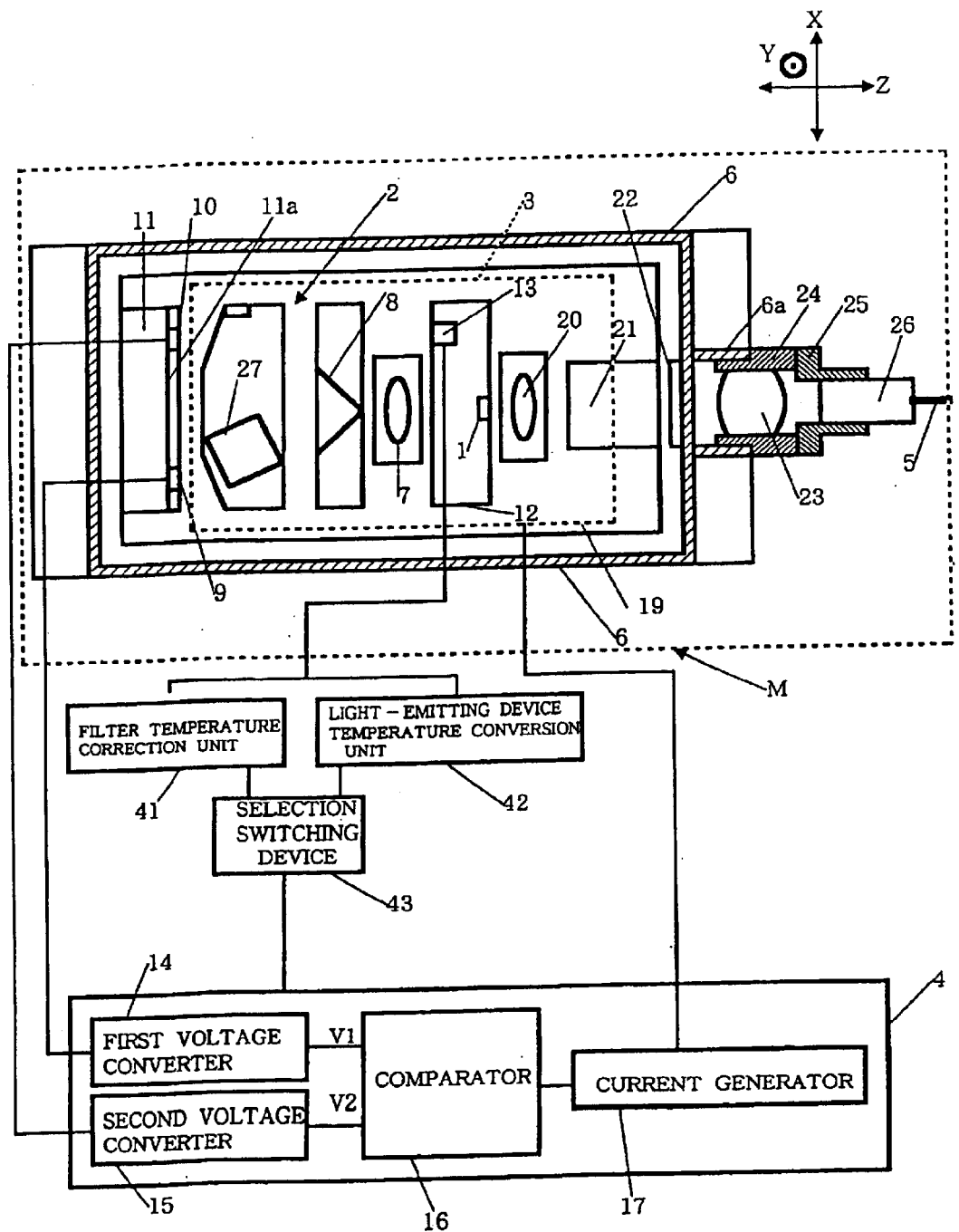
FIG. 12 is a block diagram showing a third embodiment of the present invention.

FIG. 12 is a block diagram showing a third embodiment of the present invention. In the third embodiment, there are used: a filter temperature correction unit 41 that converts a signal from the temperature detection unit 13 into a signal for correcting the temperature of the optical filter 27; a light-emitting device temperature conversion unit 42 that converts the signal from the temperature detection unit 13 into a signal for controlling the temperature of the light-emitting device 1; and a selection switching unit 43 that performs switching between signals inputted from the filter temperature correction unit 41 and the light-emitting device temperature conversion unit 42 into the control unit 4.

Fourth Embodiment

Figure 13:
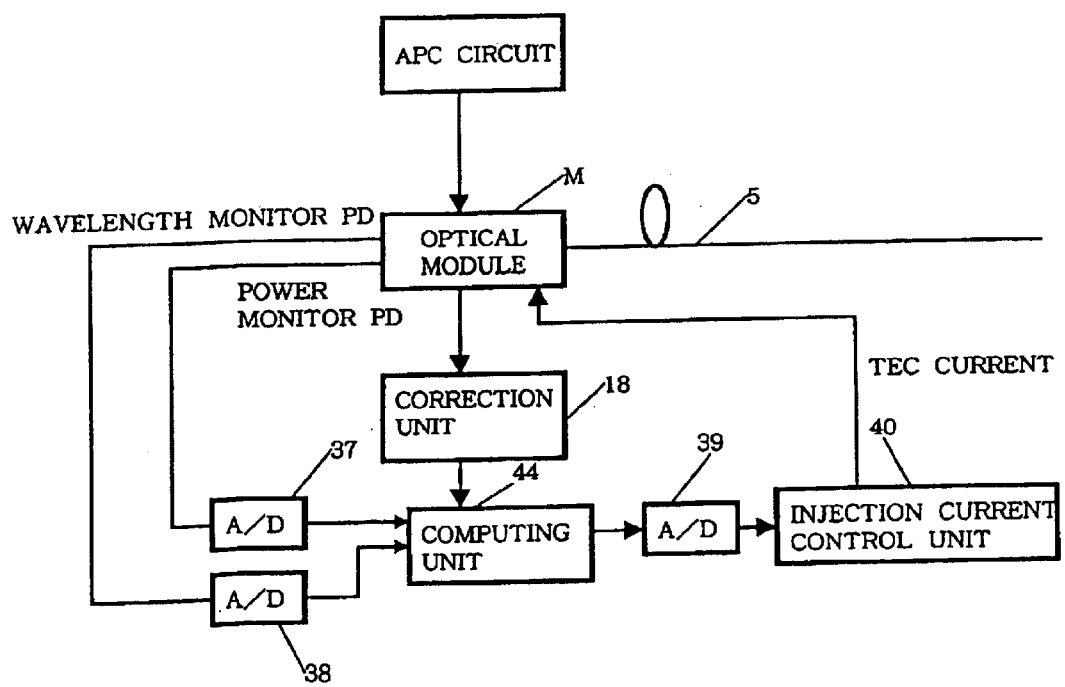
FIG. 13 is a block diagram showing a fourth embodiment of the present invention.

FIG. 13 is a block diagram showing a fourth embodiment of the present invention. As shown in FIG. 13, in the second embodiment, control is performed by using analog-digital conversion circuits 37, 38, and 39 in a control system. With the control method shown in FIG. 13, a signal generated based on a power monitor PD current and a wavelength monitor PD current is subjected to analog-digital conversion by the analog-digital conversion circuits 37 and 38. The converted signals are inputted into a computing unit 44, and this computing unit 44 computes a difference or ratio and outputs a control signal to an injection current control unit 40 through the analog-digital conversion circuit 39. The injection current control unit 40 controls an injection current to be injected into the light-emitting device 1 based on the inputted control signal and stabilizes the lasing wavelength of the light-emitting device 1.

With the technique of the fourth embodiment, by feeding the signal from the wavelength monitor unit 2 back to the injection current, it becomes possible to fix the lasing wavelength of laser light outputted from the light-emitting device 1 at a predetermined wavelength.

Fifth Embodiment

In an optical module shown in FIG. 15, the adjustment temperature of the temperature control module 56 is not limited to a state where this temperature is simply set at a fixed value. Laser light outputted from the light-emitting device 50 has temperature dependency, so that it becomes possible to adjust a lasing wavelength to be oscillated by performing the control of the temperature of the light-emitting device. Note that as the temperature control module 56, there is used a Peltier module, a heater module, or the like.

In general, in a use of, for example, such as a communication light source, the lasing wavelength of laser light is adjusted at predetermined set lasing wavelength spacing. As a result, as to the laser light outputted from the light-emitting device 50, its lasing wavelength to be oscillated is controlled through the temperature adjustment by the temperature control module 56.

Also, in the optical module described above, there is used an etalon filter as an example of the optical filter 52. The etalon filter has lasing wavelength periodicity in its light transmission characteristic. Note that aside from the etalon filter, there may be used a multi-layered film filter such as a BPF (Band Pass Filter).

Figure 29:
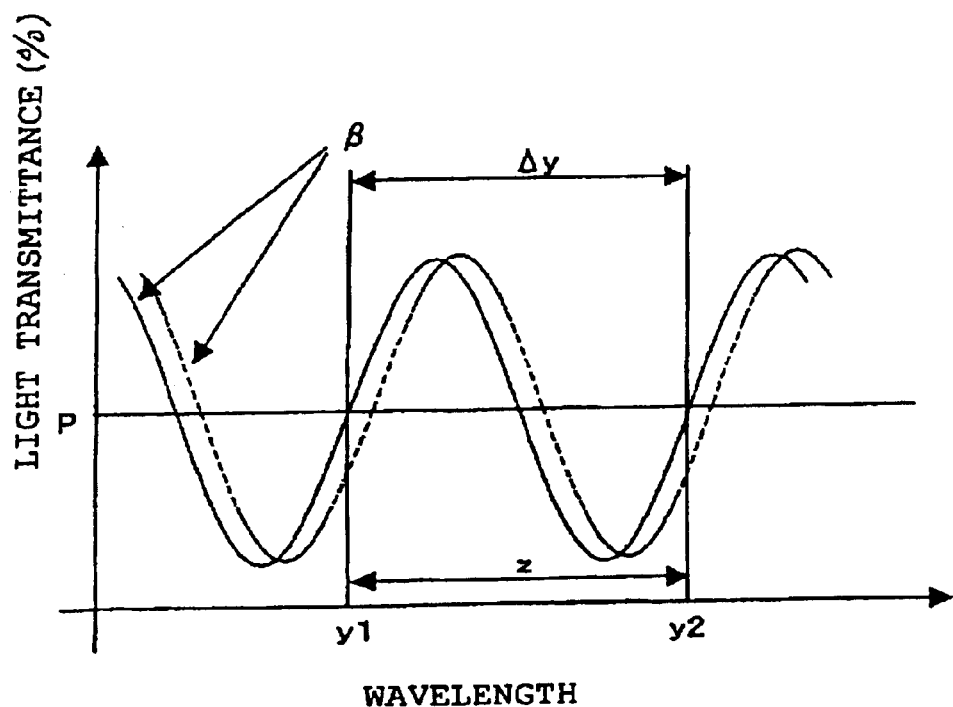
FIG. 29 is a graph showing the wavelength-light transmittance characteristic of an optical filter in a conventional optical module.

FIG. 29 is a drawing showing the wavelength-light transmittance characteristic of the optical filter 52 applied to the lasing wavelength control of the optical module. As shown in FIG. 29, a standard, such as the ITU, stipulates a predetermined set wavelength spacing $\Delta y$ (400 pm, for instance) of laser light outputted from a communication light source.

A curve $\beta$ indicated by a solid line in FIG. 29 represents the wavelength-light transmittance characteristic of an optical filter in the optical module. This curve β indicated by the solid line is set so that a predetermined light transmittance P is obtained at set lasing wavelengths y1, y2, and so on. In the optical module, the lasing wavelength of the light-emitting device 50 is set so as to be fixed at a lasing wavelength at which the light transmittance of the optical filter 52 becomes P. As a result, the wavelength width z per period of the wavelength-light transmittance characteristic of the optical filter 52 is set at Δy that is the same as the set lasing wavelength spacing described above.

However, the optical filter 52 has wavelength dependency in its light transmittance characteristic. That is, in the case where the light-emitting device 50 and the optical filter 52 are mounted on a single temperature control module 56 like in the case of the constructions shown in FIGS. 27 and 28, if the temperature control module 56 is adjusted in order to control the lasing wavelength of the light-emitting device 50, the temperature of the optical filter 52 is also changed. In this case, the light transmission characteristic of the optical filter 52 is shifted from the solid curve β to the broken line β shown in FIG. 29 due to the temperature dependency. That is, the lasing wavelength, with which there is obtained the predetermined light transmittance P, is shifted from the set wavelength described above, and consequently it becomes impossible to adjust the lasing wavelength of laser light outputted from the light-emitting device 50 so as to have a desired value.

The temperature dependency of the optical filter 52 like this is slight. However, in particular, in a communication light source for DWDM (Dence-Wavelength Division Multiplexing) that has been evolved in recent years, the lasing wavelength of laser light outputted from the optical device 50 is set at narrow lasing wavelength spacing of around 400 pm or the like. Consequently, it is required to perform control with high precision.

In the fifth embodiment, there will be provided an optical module that is capable of adjusting the lasing wavelength of laser light outputted from the light-emitting device with high precision.

Figure 26:
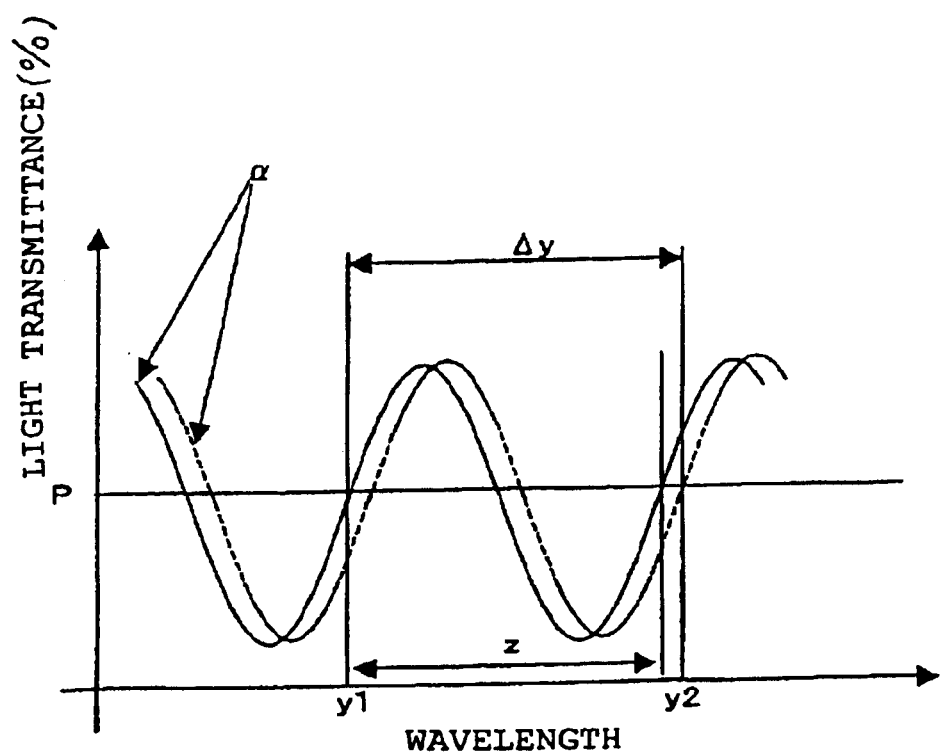
FIG. 26 is a graph showing an example of the wavelength-light transmittance characteristic of an optical filter in an optical module according to a fifth embodiment of the present invention.

FIG. 26 is a drawing showing the wavelength-light transmittance characteristic of an optical filter applied to an optical module according to the fifth embodiment. This optical module has the construction shown in FIG. 15, for instance. As shown in FIG. 26, in this optical module, the wavelength width z per period of the wavelength-light transmittance characteristic of the optical filter 52 is set as expressed by Expression (1) given below.

$$Z=\Delta y(1-a/x)$$

Here, x is a shift amount per unit temperature of a lasing wavelength in the light-emitting device,
Δy is a set lasing wavelength spacing in the lasing wavelength control unit,
z is a wavelength width per period of the wavelength-light transmittance curve of the optical filter, and
a is a shift amount per unit temperature of the wavelength-light transmittance characteristic of the optical filter.

In the case where setting has been made in this manner, if a temperature control module is adjusted so that the wavelength of light outputted from the light-emitting device is shifted from y1 to y2 as shown in FIG. 26, a curve a is wavelength-shifted from the solid line to the broken line. That is, at the wavelength y2, the light transmittance becomes P. Accordingly, the wavelength of light outputted from the light-emitting device is fixed at this wavelength y2.

For instance, x is set at 100 pm per degree centigrade, Δy is set at 400 pm, and a is set at 5 pm per degree centigrade, z becomes 380 pm as a result of calculation.

With the conventional technique, in order to adjust the lasing wavelength of laser light outputted from the light-emitting device so as to become Δy, that is, in order to perform adjustment so as to shift the lasing wavelength to the long wavelength side by 400 pm, the temperature control module is adjusted so that a current temperature is raised by 4 degrees centigrade because the shift amount x per unit temperature of the lasing wavelength in the light-emitting device is 100 pm per degree centigrade. During this operation, in a conventional optical module, no consideration is given to the influence of the temperature dependency of the optical filter 52, so that the lasing wavelength is adjusted so as to be shifted from the original wavelength to the long wavelength side by 420 pm. That is, the temperature dependency of the lasing wavelength of the optical filter 52 is 5 pm per degree centigrade, so that if the temperature is raised by 4 degrees centigrade, the lasing wavelength is shifted to the long wavelength side by 20 pm.

In contrast to this, in the optical module described in the fifth embodiment of the present invention, consideration is given to the influence of the temperature dependency of the lasing wavelength of the optical filter 52 using Expression (1) in advance and there is performed the adjustment of the wavelength of light outputted from the optical device. That is, there is performed the adjustment of the temperature control module. Consequently, in the case where the lasing wavelength of laser light outputted from the light-emitting device is adjusted to the long wavelength side by Δy=400 pm, if the temperature dependency of the lasing wavelength of the optical filter 52 is 5 pm per degree centigrade, this adjustment is realized by setting z at 380 pm. That is, the temperature of the temperature control module is adjusted so that the lasing wavelength of laser light outputted from the light-emitting device 50 is shifted to the short wavelength side by a degree corresponding to the temperature dependency of the lasing wavelength of the optical filter 52. Note that the technique of this embodiment is applicable to a short wavelength side shorter than y1 or a long wavelength side longer than y2 without any problems so long as there is satisfied Expression (1) described above.

Further, it is preferable that the value of the light transmittance P, at which a wavelength is fixed, exists in the vicinity of the steepest portion of the light transmittance of the optical filter, that is, at a portion at which there is obtained the greatest value of the rate of change of the light transmittance. In more detail, by taking the case shown in FIG. 29 as an example, the value of the light transmittance P, at which a wavelength is fixed, becomes a value that is lowered from the maximum value of the light transmittance characteristic by approximately 50%, that is, a value increased from the minimum value by approximately 50%. This is because it is required to detect a minute shift occurring to the lasing wavelength of laser light outputted from the light-emitting device. Also, in the optical module of this fifth embodiment, it is possible to perform high-precision adjustment by controlling the lasing wavelength of laser light outputted from the optical device so that Expression (1) described above is satisfied. As a result, a value corresponding to the steepest portion of the light transmittance is set as the value of the light transmittance P for wavelength fixation.

Further, in order to perform setting so that the solid curve a overlaps the position of a predetermined light transmittance P like this at the initial wavelength y1, it is enough that the optical filter is rotated about an axis vertical to a light transmission direction and the curve a is wavelength-shifted. By rotating the optical filter like this, the optical path length of laser light passing through the optical filter is elongated, so that the wavelength is shifted.

The wavelength width z per period of the wavelength-light transmittance characteristic in the optical filter is determined by the construction and material of the optical filter. In more detail, this wavelength width z is determined by the product of the thickness of the optical filter and the refractive index of the material thereof. For instance, in the case where an etalon filter made of crystal is used as the optical filter, it is possible to adjust the wavelength width z by changing the thickness of the crystal in the light transmission direction.

As described above, it is extremely easy to change the construction of the optical filter for the sake of changing the wavelength width z, so that it is possible to swiftly cope with the changing of the lasing wavelength characteristic of the light-emitting device with the technique of the present invention.

Also, the present invention is also applicable to the case where the concrete construction of the optical module is different so long as there is satisfied Expression (1) described above.

Figure 27:
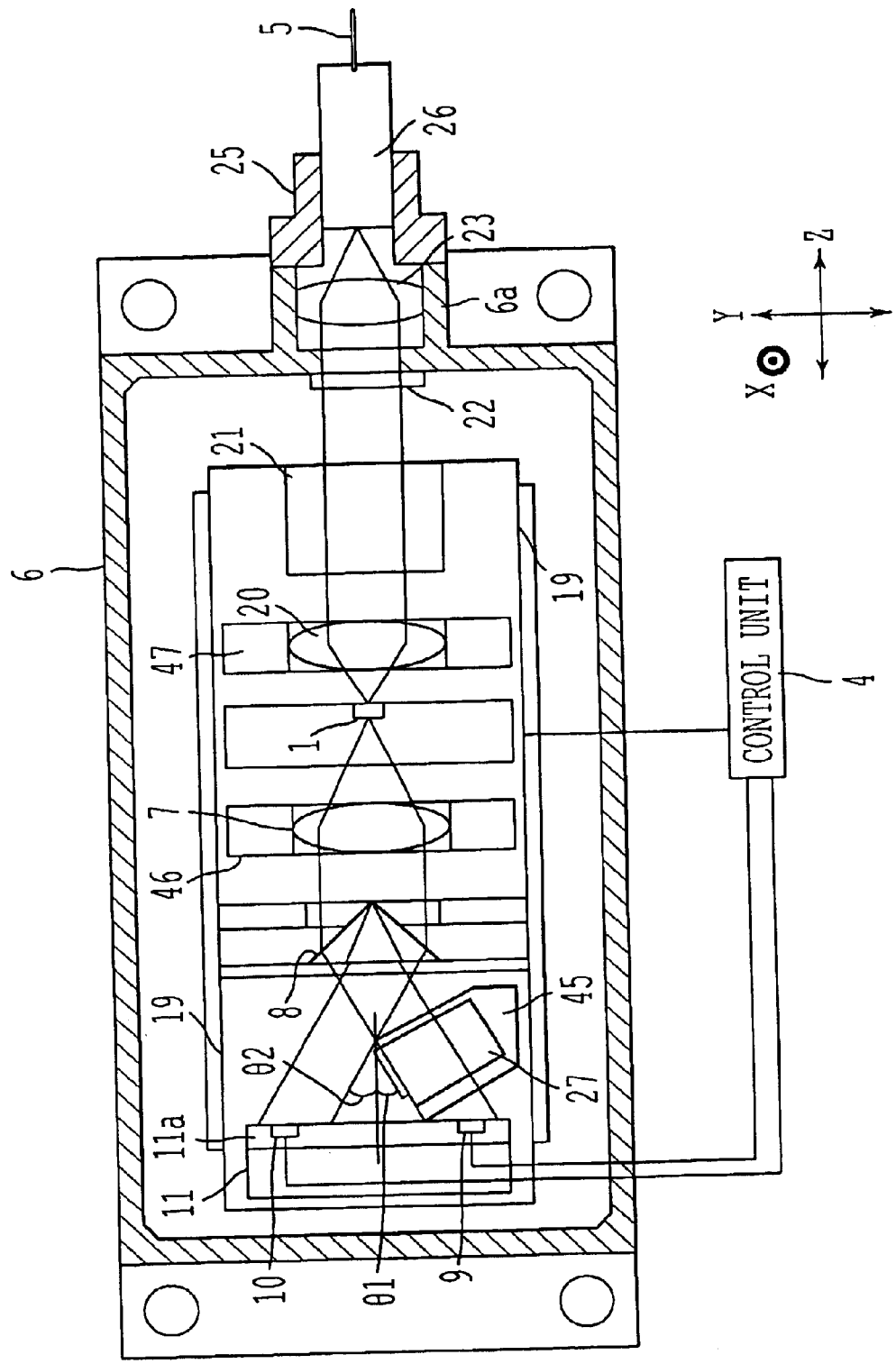
FIG. 27 is a plane cross-sectional view showing the optical module according to the fifth embodiment of the present invention.
Figure 28:
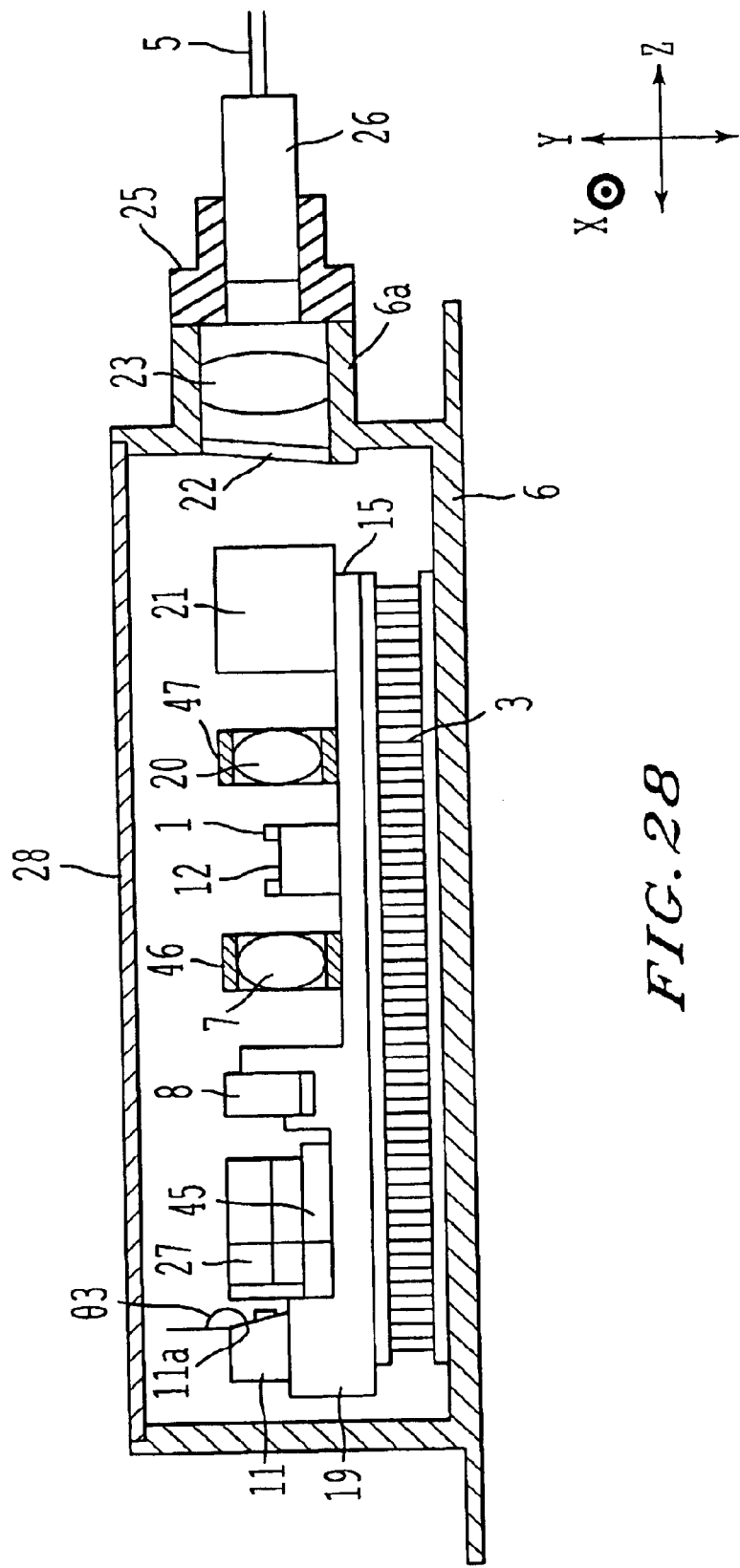
FIG. 28 is a side cross-sectional view showing the optical module according to the fifth embodiment of the present invention.

FIG. 27 is a plan cross-sectional view showing an optical module according to the fifth embodiment of the present invention that uses an optical filter like this, while FIG. 28 is a side cross-sectional view showing the optical module according to this embodiment.

As shown in FIGS. 27 and 28, the optical module according to the fifth embodiment of the present invention is fundamentally the same as the optical module according to the first embodiment. However, the optical filter 27 is produced using an etalon or the like and is fixed to a filter holder 45 using low melting point glass or solder. The thickness of the optical filter 27 in the light transmission direction is adjusted so that there is satisfied Expression (1) described above.

With the technique of the fifth embodiment, the optical filter 27 is constructed so that there is satisfied Expression (1) described above. Consequently, it is possible to perform adjustment with precision so that the lasing wavelength of laser light outputted from the light-emitting device 1 takes a desired value. Note that needless to say, the present invention is applicable to an optical module even if this optical module has a construction other than the construction described above.

Figure 30:
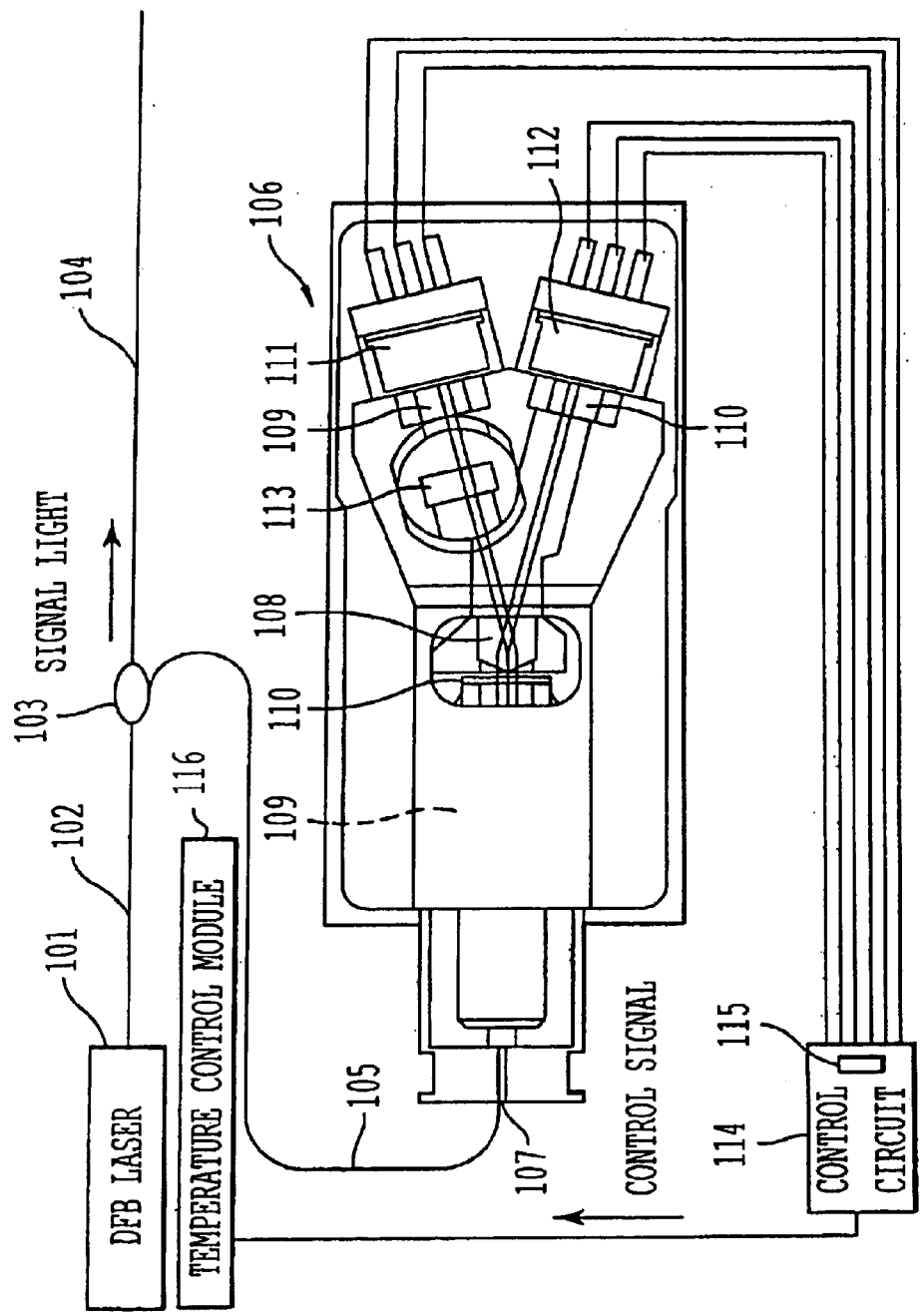
FIG. 30 is a plane cross-sectional view showing a modification of the optical module shown in FIG. 28.

Next, a modification of the optical module shown in FIG. 28 will be described with reference to FIG. 30. In FIG. 28, the optical filter and the light-emitting device are mounted on a single temperature control module (Peltier module). In FIG. 30, however, there is shown a construction where two temperature control modules are arranged and the optical filter and the light-emitting device are mounted on the two temperature control modules, respectively. The present invention is also applicable to this construction shown in FIG. 30. In this case, it is required to connect a lasing wavelength control unit to each temperature control module.

In FIG. 30, a DFB laser (DFB laser light source) is used as a light-emitting device 101 and a photo-coupler 103 is connected to this DFB laser 101 through an optical fiber 102. A part of light outputted from the DFB laser 101 is divedeed by the photo-coupler 103 and is used as measurement light. The remaining light propagates through an optical fiber 104 as signal light and is applied to a desired use. The measurement light propagates through an optical fiber 105 and is incident from an optical incident portion 107 of an optical module 106.

The optical module 106 of this embodiment includes a light-divedeing prism 108 that divedees incident light with a single wavelength incident from the optical incident portion 107 into at least two light and emits the at least two light (the incident light is the measurement light and a part of light outgoing from the DFB laser 101). In this embodiment, there is used a construction where the incident light is divedeed using the prism 108 in this manner.

It should be noted here that in this embodiment, the measurement light incident from the light incident portion 107 enters a lens 110 by passing through an optical path 109, is converted by the lens 110 into parallel light with a predetermined width, and enters a light incident surface of the prism 108.

Also, in this embodiment, light-receiving devices 111 and 112 having condensing lenses 109 and 110 and an optical filter 113 are provided on the outgoing side of the prism 108, and the optical filter 113 selectively allows light with set wavelength band including the wavelength of the incident light described above to pass therethrough at light transmittance corresponding to each wavelength.

The optical filter 113 is provided on the incident side of the light-receiving device 111. The light-receiving device 111 functions as a first light quantity detection means that receives first divedeed light, out of the lights divedeed by the prism 108, through the optical filter 113. Also, the light-receiving device 112 functions as a second light quantity detection means that directly receives second divedeed light among the lights divedeed by the prism 108.

It should be noted here that the detection output (light quantity detection information) by the light-receiving devices 111 and 112 is added to a lasing wavelength changing means 115 of a lasing wavelength control unit 114. The lasing wavelength changing means 115 detects a change of the wavelength of incident light based on the light quantity detection information by the light-receiving device 111, the light quantity detection information by the light-receiving device 112, and change detection data for detecting the wavelength changing of incident light based on these light quantity detection information.

The lasing wavelength control unit 114 is connected to a temperature control module 116 constructed using a Peltier module or the like provided in the light-emitting device 101, and is connected to the light-receiving devices 111 and 112. The lasing wavelength control unit 114 performs the control of the temperature of the temperature control module 116 provided in the light-emitting device 101 in accordance with the detection results of the light-receiving devices 111 and 112. Note that, if the present invention is applied to an optical module of this type, the effect of the present invention becomes particularly profound in the case of a construction where the temperature of the optical filter 113 is not adjusted.

It should be noted here that needless to say, the present invention is applicable to an optical module even if this optical module has a construction other than the construction described above.

Sixth Embodiment

Figure 14:
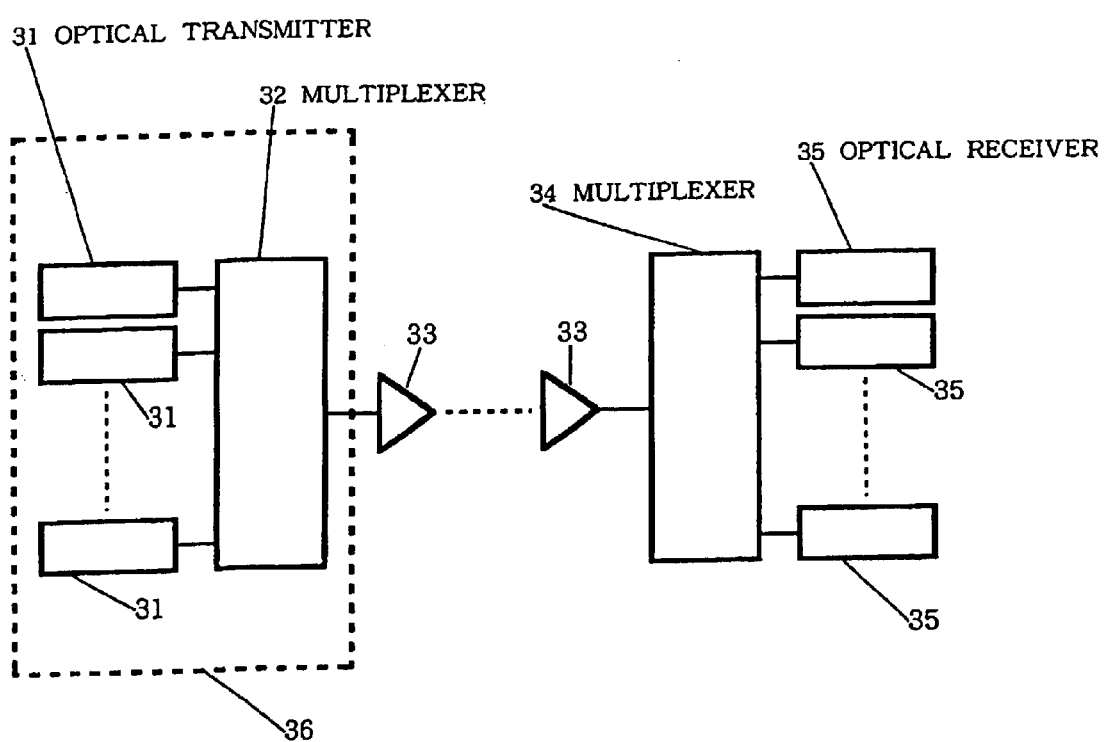
FIG. 14 is an explanatory drawing showing a WDM optical transmission apparatus applied to a wavelength division multiplexing communication system according to a sixth embodiment of the present invention.

FIG. 14 is an explanatory drawing showing a WDM optical transmission apparatus used in a wavelength division multiplexing communication system according to a sixth embodiment of the present invention.

As shown in FIG. 14, the wavelength division multiplexing communication system includes a plurality of optical transmitters 31 that each transmit an optical signal, a multiplexer 32 that wavelength-multiplexes optical signal transmitted from the optical transmitters 31 over a plurality of channels, a plurality of optical amplifiers 33 connected in a plurality of stages in order to amplify and relay multiplexed optical signals obtained as a result of the wavelength-multiplexing by the multiplexer 32, a splitter 34 that wavelength-separates the optical signals amplified by the optical amplifiers 33 for each channel, and a plurality of optical receivers 35 that receive respective optical signals that have been wavelength-separated by the splitter 34.

The WDM optical transmission apparatus 36 according to the sixth embodiment of the present invention includes the plurality of optical transmitters 31 according to the first to fifth embodiments and transmits optical signals outputted from these optical transmitters 31 while wavelength-multiplexing the optical signals. Accordingly, there is stabilized the wavelength of the optical signal oscillated from each optical transmitter 31, so that it becomes possible to construct a dense WDM system having high degree of reliability.

The present invention is not limited to the embodiments described above and it is possible to make various modifications without departing from technical scopes described in the appended claims. For instance, as a light divedeing device, there may be used a beam splitter, such as a half mirror, in place of the prism 8.

What is claimed is:

1. A method of controlling a wavelength of a semiconductor laser comprising:
   detecting a temperature of a light-emitting device configured to output laser light;
   monitoring a wavelength of the laser light output from the light-emitting device and subsequently passed through an optical filter;
   adjusting the wavelength of the laser light based on a signal corresponding to the monitored wavelength;
   estimating a temperature of the optical filter based on the detected light-emitting device temperature; and
   correcting the adjusted wavelength of the laser light based on the estimated optical filter temperature.

2. The method of controlling a wavelength of a semiconductor laser according to claim 1, wherein said step of adjusting comprises:
   adjusting the temperature of the light-emitting device.

3. The method of controlling a wavelength of a semiconductor laser according to claim 1, wherein said step of adjusting comprises:
   adjusting an injection current injected into the light-emitting device.

4. The method of controlling a wavelength of a semiconductor laser according to claim 1, wherein said step of monitoring comprises:
   dividing the laser light into two component laser lights; and
   receiving the divided two component laser lights by respective light receivers each configured to photoelectrically convert received laser light, and output converted laser light as electric signals; and
   optically filtering at least one of the two component laser lights.

5. The method of controlling a wavelength of a semiconductor laser according to claim 4, wherein said step of dividing comprises:
   dividing with a prism.

6. The method of controlling a wavelength of a semiconductor laser according to claim 1, wherein said step of adjusting comprises: locking the wavelength at a predetermined value within a predetermined wavelength range.

7. An optical transmitter comprising:
   an optical module including a light-emitting device that outputs laser light;
   a temperature detection unit that detects a temperature of the light-emitting device;
   a wavelength monitor unit that monitors a wavelength of the laser light output from the light-emitting device and having passed through an optical filter;
   a wavelength adjustment unit that adjusts the wavelength of the laser light output from the light-emitting device based on monitored wavelength;
   a control unit that fixes the lasing wavelength of the laser light output from the light-emitting device to a predetermined wavelength based on the monitored wavelength; and
   a correction unit that estimates the temperature of the optical filter, based on the detected temperature of the light-emitting device, and outputs to the control unit a wavelength shift correction signal.

8. A WDM optical transmission apparatus comprising:
   a plurality of optical transmitters, each comprising
      an optical module including a light-emitting device that outputs laser light,
      a temperature detection unit that detects a temperature of the light-emitting device,
      a wavelength monitor unit that monitors a wavelength of the laser light output from the light-emitting device and having passed through an optical filter,
      a wavelength adjustment unit that adjusts the wavelength of the laser light output from the light-emitting device based on the monitored wavelength,
      a control unit that fixes the lasing wavelength of the laser light output from the light-emitting device to a predetermined wavelength based on the monitored wavelength, and
      a correction unit that estimates the temperature of the optical filter, based on the detected temperature of the light-emitting device, and outputs to the control unit a wavelength shift correction signal; and
   a wavelength-multiplexer configured to optically multiplex the optical signals output from the plurality of optical transmitters.

9. An optical module comprising:
   a light-emitting device that outputs laser light;
   an optical filter through which laser light output from a light-emitting device passes;
   a temperature control module that controls a temperature of the light emitting device and the optical filter;
   a light-receiving device that receives the laser light through the optical filter; and
   a lasing wavelength control unit that controls temperature of the light-emitting device based on detection results of the light-receiving device,
   wherein the lasing wavelength control unit satisfies the following relation:

$z = \Delta y(1-a/x)$, where x is a shift amount per unit temperature of a lasing wavelength in the light-emitting device,
   $\Delta y$ is a predetermined lasing wavelength spacing,
   z is a wavelength width per period of a wavelength-light transmittance curve of the optical filter, and a is a shift amount per unit temperature of a wavelength-light transmittance characteristic of the optical filter.

10. The optical module according to claim 9, wherein the optical filter and the light-emitting device are arranged on a single temperature control module.

11. The optical module according to claim 9, wherein the optical filter is an etalon filter.

12. The optical module according to claim 9, wherein the optical filter is a dielectric multi-layered film.

13. The optical module according to claim 9, wherein the temperature control module is a Peltier module.

14. The optical module according to claim 9, wherein the temperature control module is a heater.

15. An optical module comprising:
    an optical filter through which laser light output from a light emitting device passes;
    a temperature detection module that detects a temperature of the optical filter;
    a light-receiving device that receives the laser light passed through the optical filter; and
    a lasing wavelength control unit that performs control of a temperature of the light-emitting device based on detection results of the light-receiving device and the temperature detection module,
    wherein the lasing wavelength control unit satisfies the following relation:

$z=\Delta y(1-a/x)$, where x is a shift amount per unit temperature of a lasing wavelength,
    $\Delta y$ is a predetermined lasing wavelength spacing in the lasing wavelength control unit,
    z is a wavelength width per period of a wavelength-light transmittance curve of the optical filter, and
    a is a shift amount per unit temperature of a wavelength-light transmittance characteristic of the optical filter.

16. The optical module according to claim 15, wherein the optical filter is an etalon filter.

17. The optical module according to claim 15, wherein the optical filter is a dielectric multi-layered film.

18. The optical module according to claim 15, wherein the temperature control module is a Peltier module.

19. The optical module according to claim 15, wherein the temperature control module is a heater.

20. A method of controlling a wavelength of an optical module, comprising the steps of:
    (a) generating a waveform with periodicity by having laser light output from a light-emitting device pass through an optical filter;
    (b) detecting light intensity exiting from the optical filter; and
    (c) detecting a change of lasing wavelength of the laser light output from the light-emitting device; and
    (d) controlling a temperature of the light-emitting device so as to satisfy the following relation:

$z=\Delta y(1-a/x)$, where x is a shift amount per unit temperature of a lasing wavelength,
    $\Delta y$ is a predetermined lasing wavelength spacing in the lasing wavelength control unit,
    z is a wavelength width per period of a wavelength-light transmittance curve of the optical filter, and
    a is a shift amount per unit temperature of a wavelength-light transmittance characteristic of the optical filter.

21. A method of controlling a wavelength of a semiconductor laser comprising:
    means for detecting a temperature of a light-emitting device configured to output laser light;
    means for monitoring a wavelength of the laser light output from the light-emitting device and subsequently passed through an optical filter;
    means for adjusting the wavelength of the laser light based on a signal corresponding to the monitored wavelength,; estimating a temperature of the optical filter based on the detected light-emitting device temperature; and
    means for correcting the adjusted wavelength of the laser light based on the estimated optical filter temperature.

* * * * *